US 6,615,603 B2

(12) United States Patent
Tanaka et al.

(10) Patent No.: US 6,615,603 B2
(45) Date of Patent: Sep. 9, 2003

(54) COOLING SYSTEM OF HEAT EMITTERS

(75) Inventors: Masaaki Tanaka, Nagoya (JP); Shigeo Numazawa, Kariya (JP); Katsuya Ishii, Nagoya (JP); Hideaki Sato, Anjyo (JP); Shin Honda, Nagoya (JP); Yoshiyuki Okamoto, Nagoya (JP); Junichiro Kanamori, Nisshin (JP); Tadayoshi Terao, Toyoake (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/082,652

(22) Filed: Feb. 25, 2002

(65) Prior Publication Data

US 2002/0092315 A1 Jul. 18, 2002

Related U.S. Application Data

(63) Continuation of application No. PCT/JP01/06308, filed on Jul. 19, 2001.

(30) Foreign Application Priority Data

Jul. 21, 2000 (JP) ........................................ 2000-220911
Jun. 15, 2001 (JP) ........................................ 2001-182029

(51) Int. Cl.[7] ........................ F25D 23/12; F25B 15/00; H05K 7/20
(52) U.S. Cl. ........................ 62/259.2; 62/112; 62/480; 165/104.33; 361/688
(58) Field of Search ................... 62/259.2, 112, 62/477, 478, 480; 165/104.33, 104.26, 104.14, 66, 46; 361/676, 688, 697

(56) References Cited

U.S. PATENT DOCUMENTS

| 5,024,064 | A | * | 6/1991 | Yonezawa et al. ............. 62/480 |
| 5,396,775 | A | * | 3/1995 | Rockenfeller et al. ...... 62/259.2 |
| 5,406,807 | A | * | 4/1995 | Ashiwake et al. ............. 62/376 |
| 6,131,647 | A | | 10/2000 | Suzuki et al. |
| 6,138,469 | A | * | 10/2000 | Davidson et al. ........... 62/259.2 |

FOREIGN PATENT DOCUMENTS

| JP | 60-23831 | 6/1985 |
| JP | 2-306068 | 12/1990 |
| JP | 6-50205 | 6/1994 |
| JP | 7-501394 | 2/1995 |
| JP | 9-138044 | 5/1997 |

* cited by examiner

Primary Examiner—Chen Wen Jiang
(74) Attorney, Agent, or Firm—Harness, Dickey & Pierce, PLC

(57) ABSTRACT

Heat is absorbed from a first heat emitter and a second heat emitter is cooled by an adsorption type refrigerator operating by that absorbed heat. When the amount of emission of heat of the first heat emitter exceeds a predetermined amount of heat, the heat absorbed in the heat medium by a first heat collector is discharged to the outside air by an outdoor unit without being supplied to the adsorbent of the refrigerator. On the other hand, when the amount of emission of heat of the first heat emitter falls below a predetermined amount, the heat medium which had been supplied to a first heat exchanger for heating the adsorbent is switched to return to the first heat collector without flowing to the outdoor unit.

31 Claims, 24 Drawing Sheets

COOLING SYSTEM OF HEAT EMITTERS

CROSS-REFERENCE TO RELATED APPLICATION

This is a continuation of PCT Application No. PCT/JP01/06308.

BACKGROUND OF THE INVENTION

1. Field of the Invention

The present invention relates to a cooling system for cooling a plurality of heat emitters in a system having a plurality of heat emitters, for example, is effective when used for cooling electronic equipment, electrical equipment, electrical converters, batteries, etc. in a cellular phone base station.

2. Description of the Related Art

Cooling systems for example for cooling electronic equipment in a base station for cellular phones all use electrical energy. The cooling systems have to be operated continuously for 24 hours. Therefore, there is the problem that generally the power consumption of the cooling systems in cellular phone base stations becomes extremely large.

SUMMARY OF THE INVENTION

The present invention, in consideration of the above problem, has as its object the provision of a cooling system for heat emitters suitable for continuous operation while saving power (saving energy).

The present invention, to achieve the above object, provides a cooling system for heat emitters characterized by absorbing heat from a first heat emitter (2) present in a closed space and cooling a second heat emitter present in the closed space by a first cooling means (4) operating by that absorbed heat. This system does not require the supply of a large power as clear from its configuration, so enables energy to be saved (power to be saved) and is suited for automatic continuous operation.

Note that as the first cooling means (4), it is preferable to use an adsorption type refrigerator having an adsorbent, which adsorbs evaporated gaseous phase refrigerant and which desorbs the adsorbed refrigerant when heated.

In the cooling system of the present invention, it is possible to additionally provide a second cooling means (11) for cooling the second heat emitter (3) without relying on the heat absorbed from the first heat emitter (2).

Due to this, even if the refrigerating capacity (cooling capacity) of the first cooling means (4) is insufficient, the second heat emitter (3) can be reliably cooled.

In the cooling system of the present invention, it is possible to provide an auxiliary heat source (12) for supplying heat to the first cooling means (4).

Due to this, even if the amount of heat required for operating the first cooling means (4) falls, it is possible to operate the first cooling means (4) by supplementing heat from the auxiliary heat source (12), so it is possible to stably cool the second heat emitter (3).

Further, in the cooling system of the present invention, it is possible to configure the system so that when the amount of emission of heat of the first heat emitter (2) exceeds a predetermined amount, the coefficient of performance of the first cooling means (4) is lowered for operation, while when the amount of emission of heat of the first heat emitter (2) falls below a predetermined amount, the coefficient of performance of the first cooling means (4) is raised for operating the first cooling means (4).

Due to this, even if the amount of emission of heat of the first heat emitter (2) fluctuates by a large extent, it is possible to flexibly deal with it.

Further, in the cooling system of the present invention, it is possible to configure the system so that when the amount of emission of heat of the first heat emitter (2) exceeds a predetermined amount, part of the heat of the first heat emitter (2) is radiated to the outside of the first cooling means (4).

Due to this, even if the amount of emission of heat of the first heat emitter (2) increases, it is possible to cool the second heat emitter (3) stably.

Note that when the temperature of the location where the first cooling means (4) radiates its heat falls below a predetermined temperature or when the first cooling means (4) breaks down, it is preferable to discharge the heat of at least the first heat emitter (2) directly to the radiated location without going through the first cooling means (4).

Further, when the temperature of heat emission of the first heat emitter (2) is higher than the temperature of heat emission of the second heat emitter (3) and the temperature of the location where the first cooling means (4) radiates its heat is lower than a predetermined temperature or when the first cooling means (4) breaks down, it is preferable to discharge the heat of the first heat emitter (2) to the radiated location of a temperature higher than the radiated location of the heat of the second heat emitter (3) without going through the first cooling means (4).

Further, when the temperature of the location where the first cooling means (4) radiates its heat is lower than a predetermined temperature or the first cooling means (4) breaks down, it is preferable to discharge the heat of one of the first heat emitter (2) and the second heat emitter (3) directly to the radiated location without going through the first cooling means (4).

Further, it is preferable to set the refrigerating capacity of the first cooling means (4) large so that the first cooling means (4) can exhibit a predetermined reference refrigerating capacity by a predetermined reference amount of emission of heat in the first heat emitter (2) even when simultaneously operating a plurality of valves (9a to 9e) provided there and switching absorbers (5) from a desorption step to an adsorption step.

Further, in the cooling system of the present invention, it is possible to provide a plurality of absorbers (5) housing an adsorbent and a plurality of valves (9a to 9e) for switching between an adsorption step and desorption step of the absorbers (5) by switching the flow of the heat medium and to make the heat medium recovering the heat from the first heat emitter (2) circulate directly to an outdoor unit (8) without going through the valves (9a to 9e) and have the outdoor unit (8) radiate the heat of the first heat emitter (2) when the valves (9a to 9e) start malfunctioning.

Due to this, it is possible to cool the first heat emitter (2) even when the valves (9a to 9e) start malfunctioning and therefore possible to improve the reliability of the cooling system.

Further, in the cooling system of the present invention, it is possible to provide a plurality of absorbers (5) housing an adsorbent, a pump for circulating the heat medium (10a), and an emergency pump (10d) and to operate the emergency pump (10d) for circulation of the heat medium absorbing the heat of the first heat emitter (2) when the pump (10a) starts malfunctioning.

Due to this, even if the pump (10a) malfunctions, it is possible to cool the first heat emitter (2), so the reliability of the cooling system can be improved.

Further, in the cooling system of the present invention, it is possible to configure the system so as to absorb heat from a first heat emitter (2) present in a closed space (1) and cool a second heat emitter (3) present in the space (1) by a first cooling means (4) operating by that absorbed heat by using as the first cooling means (4) an adsorption type refrigerator having an adsorbent which adsorbs the evaporated gaseous phase refrigerant and which desorbs the adsorbed refrigerant when heated and by operating the first cooling means (4) by an absorber (5) not suffering from a malfunction among a plurality of absorbers (5) when any one of the plurality of absorbers (5) of the first cooling means (4) starts to malfunction.

Due to this, it is possible to prevent the first cooling means (4) from ending up completely stopping, so the reliability of the cooling system can be improved.

Further, in the cooling system of the present invention, it is possible to provide a reserve tank (15) for replenishing the heat medium.

Due to this, even if leakage of the heat medium occurs, it is possible to prevent the cooling system from stopping early, so the reliability of the cooling system can be improved.

Further, in the cooling system of the present invention, it is possible to provide this reserve tank (15) above the space (1).

Due to this, it is possible to make the reserve tank (15) function as a sunlight blocking means for blocking the sunlight descending into the space (1) from above, so it is possible to reduce the cooling load of the cooling system.

Further, in the cooling system of the present invention, it is possible to provide a third refrigerator (17) having an indoor unit (17a) for recovering heat arranged inside the space (1).

Due to this, even if the amount of emission of heat of the heat emitter fluctuates, it is possible to stably cool the heat emitter.

Further, in the cooling system of the present invention, it is possible to arrange the indoor unit (17a) right after a waste heat exhaust port of at least one of the first heat emitter (2) and second heat emitter (3).

Due to this, it is possible to discharge the waste heat quickly to the outside of the space (1) before the inside of the space (1) is heated by the high temperature waste heat, so it is possible to operate the first cooling means (4) and cooling system as a whole efficiently and stably.

Further, in the cooling system of the present invention, it is possible to arrange the indoor unit (17a) at a location of a large amount of emission of heat.

Due to this, it becomes possible to cool a portion of a large amount of emission of heat and fluctuation of amount of emission of heat by a third cooling means (17) and to apply the first cooling means (4) to a portion of a slight emission of heat, so even if the first cooling means (4) is relatively small in cooling capacity, it is possible to operate the first cooling means (4) stably and possible to operate the cooling system efficiently.

Note that the first heat emitter (2) and the second heat emitter (3) are preferably electrical equipment, which operates linked with each other.

Further, the amount of emission of heat of the second heat emitter (3) is preferably made lower than the amount of emission of heat of the first heat emitter (2) at all times.

The cooling system of the present invention may be provided at a heat management system and may be provided together with equipment utilizing the heat exhausted from the cooling system.

Due to this, it is possible to utilize the heat without waste.

Note that the reference numerals in parentheses of the above means illustrate the correspondence with the specific means described with reference to the drawings in the following embodiments.

Figure 1:
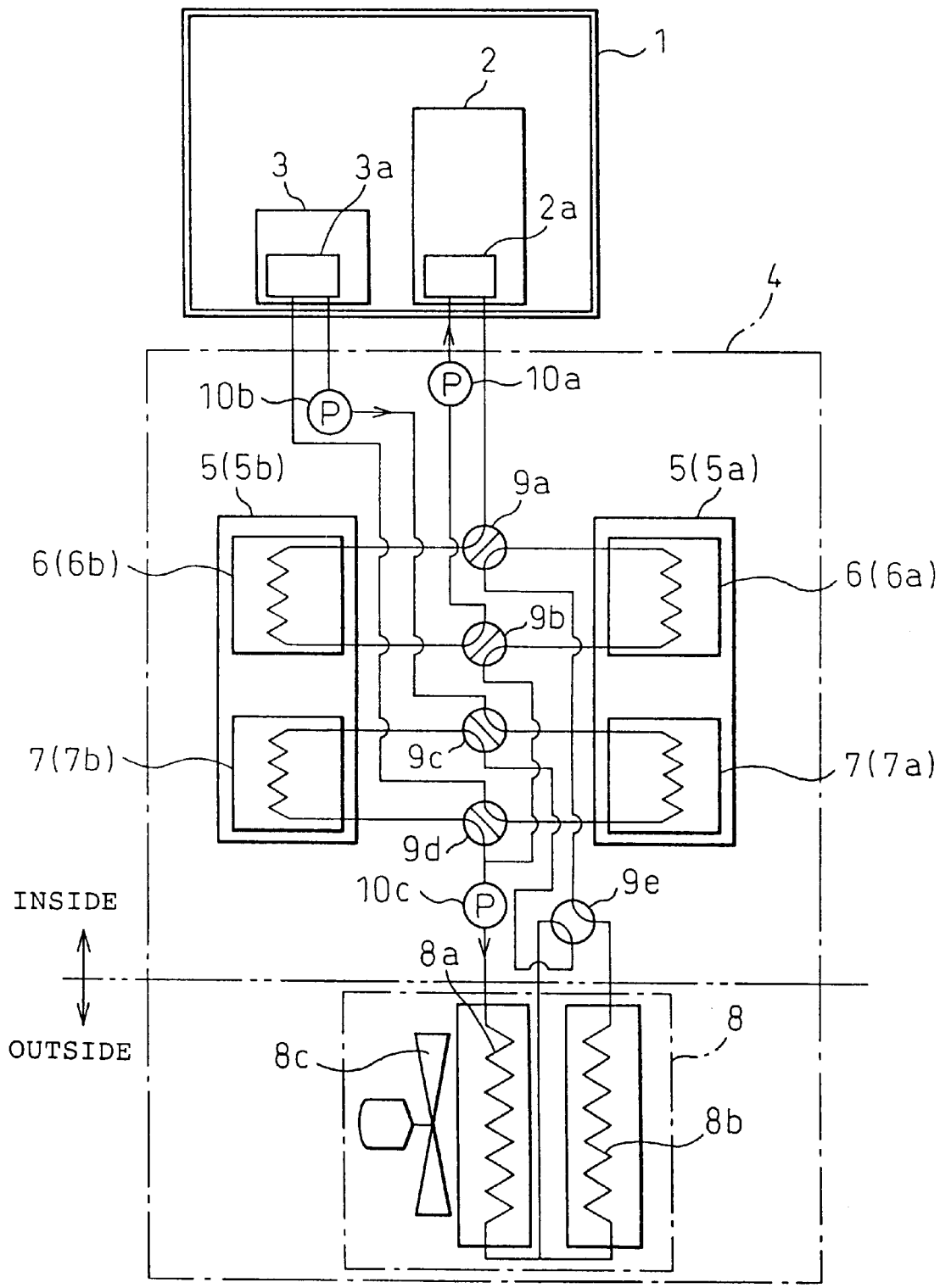
FIG. 1 is a schematic view of a cooling system according to a first embodiment of the present invention.

DESCRIPTION OF THE PREFERRED EMBODIMENT (First Embodiment)

The present embodiment applies the cooling system according to the present invention to the cooling of electronic equipment provided in a cellular phone base station (hereinafter abbreviated as a "base station") 1. The base station 1 is provided with a first heat emitter 2 comprised of a radio wave output amplifier, a radio wave output control board, a rectifier, and other electronic equipment, electrical equipment, and electrical converters, etc. having relatively large amounts of emission of heat and becoming high in temperature, a second heat emitter 3 comprised of a circuit control board, battery, and other electronic equipment, electrical equipment, electrical converters, etc. requiring cooling to a temperature lower than the first heat emitter 2, and a refrigerator 4 for cooling the two heat emitters 2 and 3 (portion shown by one-dot chain line). Note that the two heat emitters (electrical equipment) 2 and 3 are not operated alone (independently), but the two 2 and 3 are operated linked with each other.

Here, the refrigerator (first cooling means) 4 is an adsorption type refrigerator, which operates by absorbing the heat from the first heat emitter 2 and heating an adsorbent by the absorbed heat. The adsorption type refrigerator (refrigerator 4) will be explained in detail below.

The adsorbent used in the refrigerator 4 adsorbs the refrigerant (in the present embodiment, water), while desorbs the adsorbed refrigerant when heated. In the present embodiment, silica gel or zeolite or another solid adsorbent is used.

Reference numeral 5 is an absorber with an inside in a substantially vacuum state and sealed with a refrigerant. The absorber 5 houses a first heat exchanger (adsorption core) 6 for exchanging heat between an absorbent and a heat medium (in the present embodiment, water containing an ethylene glycol based antifreeze) and a second heat exchanger (evaporation/condensation core) 7 for exchanging heat between the heat medium and the refrigerant sealed in the absorber 5.

Note that in the present embodiment, a plurality (two) of absorbers 5a and 5b are used. The absorber 5a at the right side in the figure (hereinafter called the "first absorber 5a") and the absorber 5b at the left side in the figure (hereinafter called the "second absorber 5b") are the same in configuration, so when the two are referred to generally, they will simply be expressed as the "absorbers 5". Further, the suffix a of the heat exchangers 6 and 7 show that the heat exchangers are inside the first absorber 5a, while b shows that the heat exchangers are inside the second absorber 5b.

Reference numeral 8 is an outdoor heat exchanger (hereinafter called an "outdoor unit") arranged outside of the building of the base station 1 and exchanging heat between the heat medium and the outside air (radiated location). The outdoor unit 8 is comprised of first and second radiators 8a and 8b and a fan 8c for blowing cooling air. The first radiator 8a is provided at the upstream side of the flow of cooling air from the second radiator 8b.

Note that reference numeral 2a is a first heat collector which collects the heat generated in the first heat emitter 2 and exchanges heat between the heat and the heat medium, while 3a is a second heat collector which collects the heat generated in the second heat emitter 3 and exchanges heat between the heat and the heat medium. Further, 9a to 9e are rotary type valves (hereinafter referred to as "valves") for switching the flow of the heat medium, while 10a to 10c are pumps for circulating the heat medium.

Next, the operation of the cooling system according to the present embodiment will be explained.

1. Basic Operating Mode of Refrigerator 4

(Adsorption Type Refrigerator)

This mode is one where the first and second basic operating modes explained below are switched between every predetermined time. Note that the "predetermined time" is suitably selected based on the time required for desorption of the refrigerant adsorbed on the adsorbent.

Note that in the present embodiment, the first heat emitter 2 is cooled (heat is absorbed) so as to become not more than 150° C., while the second heat emitter 3 is cooled to not more than the temperature of the outside air (55° C. to 60° C.). Further, the refrigerator (adsorption type refrigerator) 4 is determined in dimensions so as to exhibit a predetermined refrigerating capacity at 70° C. to 100° C.

Further, as clear from the following description of the operation, to stably operate the refrigerator 4, it is necessary that the amount of emission of heat of the second heat emitter 3 be not more than the amount of emission of heat of the first heat emitter 2 at all times.

1.1. First Basic Operating Mode

Figure 2:
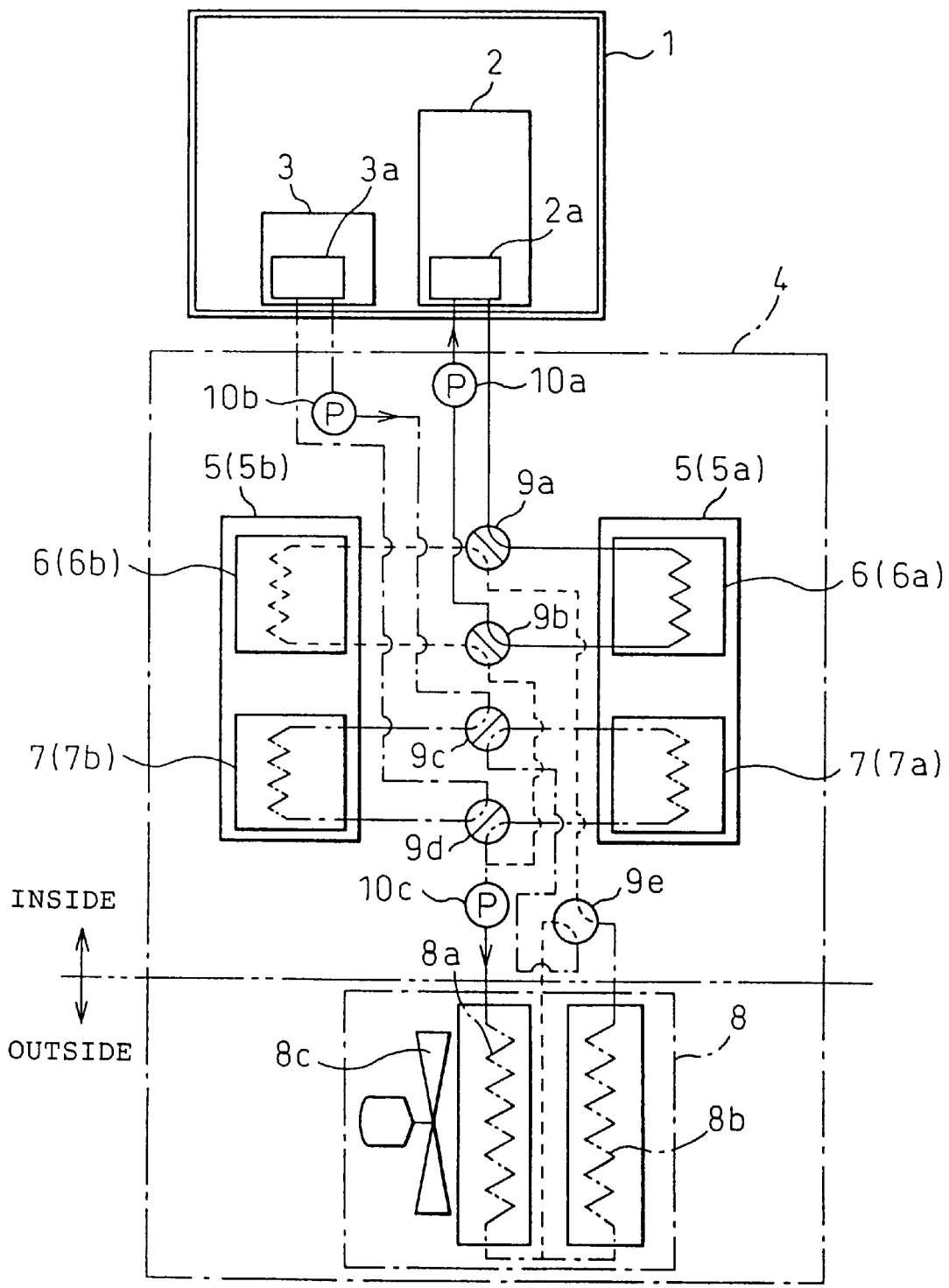
FIG. 2 is a schematic view of the flow of a heat medium in a first basic operating mode according to the first embodiment of the present invention.

In this mode, as shown in FIG. 2, by circulating a heat medium between the second heat collector 3a and the second heat exchanger 7b of the second absorber 5b and by evaporating the refrigerant in the second absorber 5b and supplying a cooled heat medium to the second heat collector 3a, the second heat emitter 3 is cooled, while the gaseous phase refrigerant (steam) evaporated in the second absorber 5b is adsorbed by the adsorbent in the second absorber 5b.

At this time, the adsorbent generates an amount of heat corresponding to the heat of condensation. If the temperature of the adsorbent rises, its adsorption capacity falls, so the adsorbent is cooled by supplying the heat medium cooled by the outdoor unit 8 to the first heat exchanger 6b of the second absorber 5b.

On the other hand, the first heat exchanger 6a of the first absorber 5a supplies the heat absorbed in the heat medium in the first heat collector 2a to the adsorbent of the first absorber 5a through the heat medium to heat the adsorbent and cause desorption of the refrigerant adsorbed on the adsorbent and supplies the heat medium cooled in the outdoor unit 8 to the second heat exchanger 7a of the first absorber 5a to cool and condense the desorbed gaseous phase refrigerant (steam) by the second heat exchanger 7a.

Below, an absorber 5 in a state causing the refrigerant to evaporate to exhibit a refrigerating capacity and, while doing so, causing the evaporated gaseous phase refrigerant to be adsorbed by the adsorbent will be referred to as "an absorber 5 in the adsorption step", while an absorber 5 in a state heating the adsorbent to cause the desorption of the adsorbed refrigerant and, while doing so, causing the desorbed refrigerant to cool and condense will be referred to as "an absorber 5 in the desorption step".

1.2. Second Basic Operating Mode

This mode, opposite to the first basic operating mode, uses the first absorber 5a for the adsorption step and the second absorber 5b for the desorption step.

Figure 3:
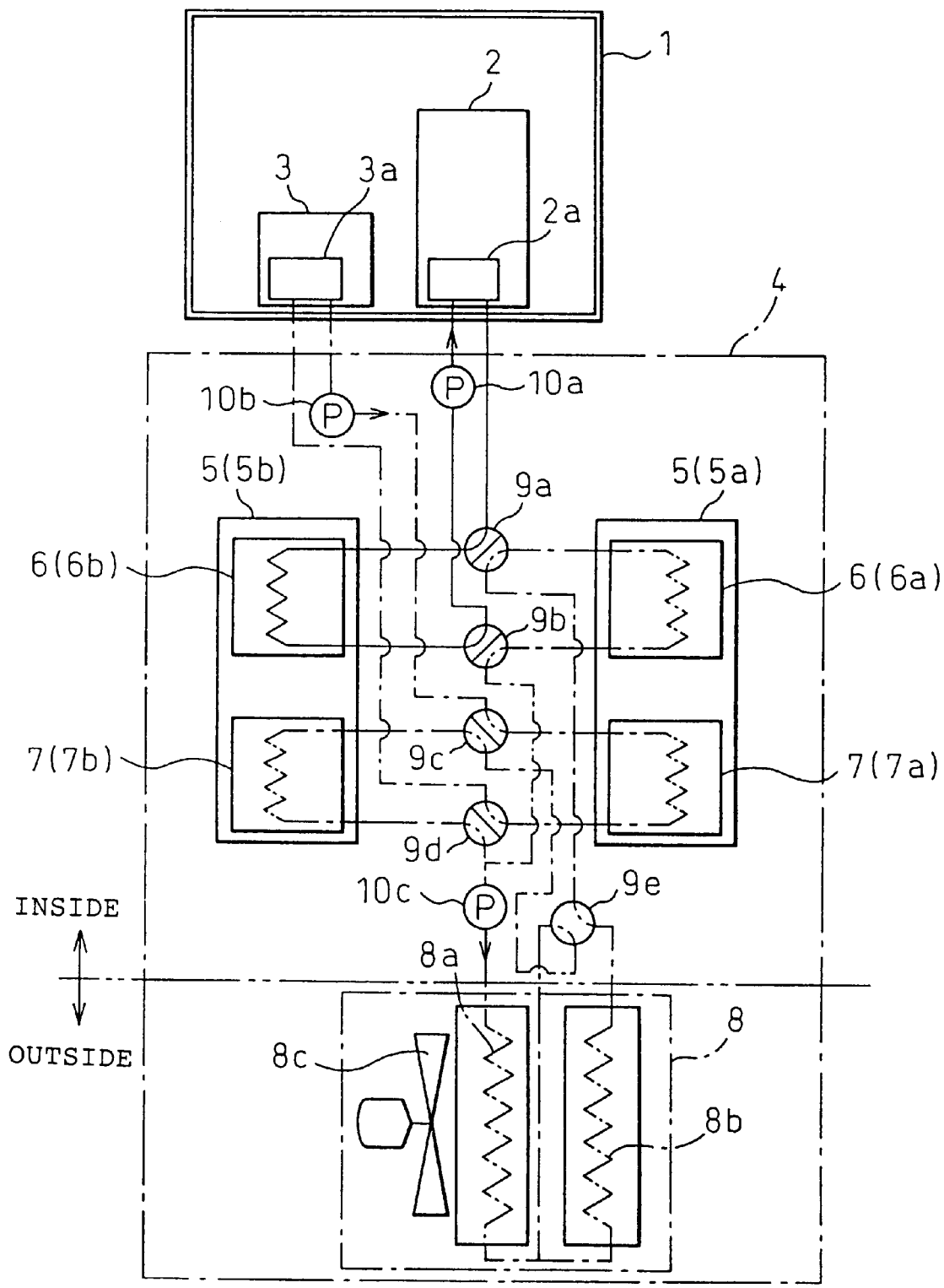
FIG. 3 is a schematic view of the flow of a heat medium in a second basic operating mode according to the first embodiment of the present invention.

Specifically, as shown in FIG. 3, by circulating a heat medium between the second heat collector 3a and the second heat exchanger 7a of the first absorber 5a, the refrigerant inside the first absorber 7a is evaporated. By supplying the cooled heat medium to the second heat collector 3a, the second heat emitter 3 is cooled. The gaseous phase refrigerant (steam) evaporated in the first absorber 5a is adsorbed by the adsorbent in the first absorber 5a.

At this time, the heat medium cooled in the outdoor unit 8 is supplied to the first heat exchanger 6a of the first absorber 5a to cool the adsorbent.

On the other hand, the first heat exchanger 6b of the second absorber 5a is supplied with the heat absorbed in the heat medium in the first heat collector 2a at the adsorbent of the second absorber 5b through the heat medium to heat the adsorbent and cause desorption of the refrigerant adsorbed on the adsorbent. The heat medium cooled in the outdoor unit 8 is supplied to the second heat exchanger 7b of the second absorber 5b, and the desorbed gaseous phase refrigerant (steam) is cooled and condensed by the second heat exchanger 7b.

2. Excess Heat Operating Mode

This operating mode is used when the amount of emission of heat of the first heat emitter 2 exceeds a predetermined amount of heat, which can be absorbed by the refrigerator 4 (adsorbent) (for example, the maximum refrigerating capacity of the refrigerator 4 divided by the maximum coefficient of performance (COP) of the refrigerator 4).

Specifically, when switching between the first basic operating mode and the second basic operating mode, the valve 9b for switching the heat medium outlet side of the first heat exchanger 6 is made to operate before the valve 9a for switching the heat medium inlet side of the first heat exchanger 6, then the valve 9a is operated after the elapse of a predetermined time.

Figure 4:
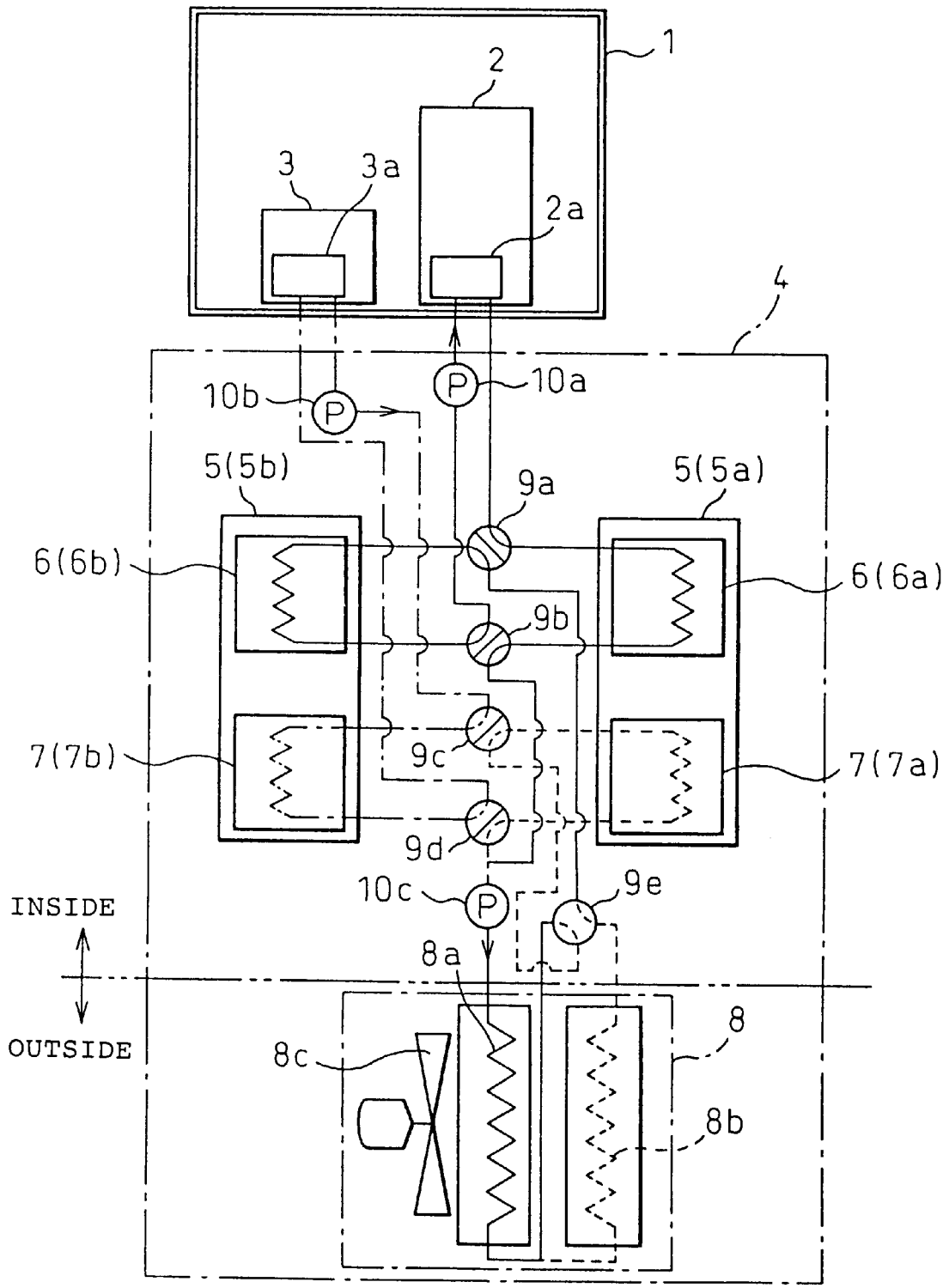
FIG. 4 is a schematic view of the flow of the heat medium in an excess heat-operating mode according to the first embodiment of the present invention.
Figure 5:
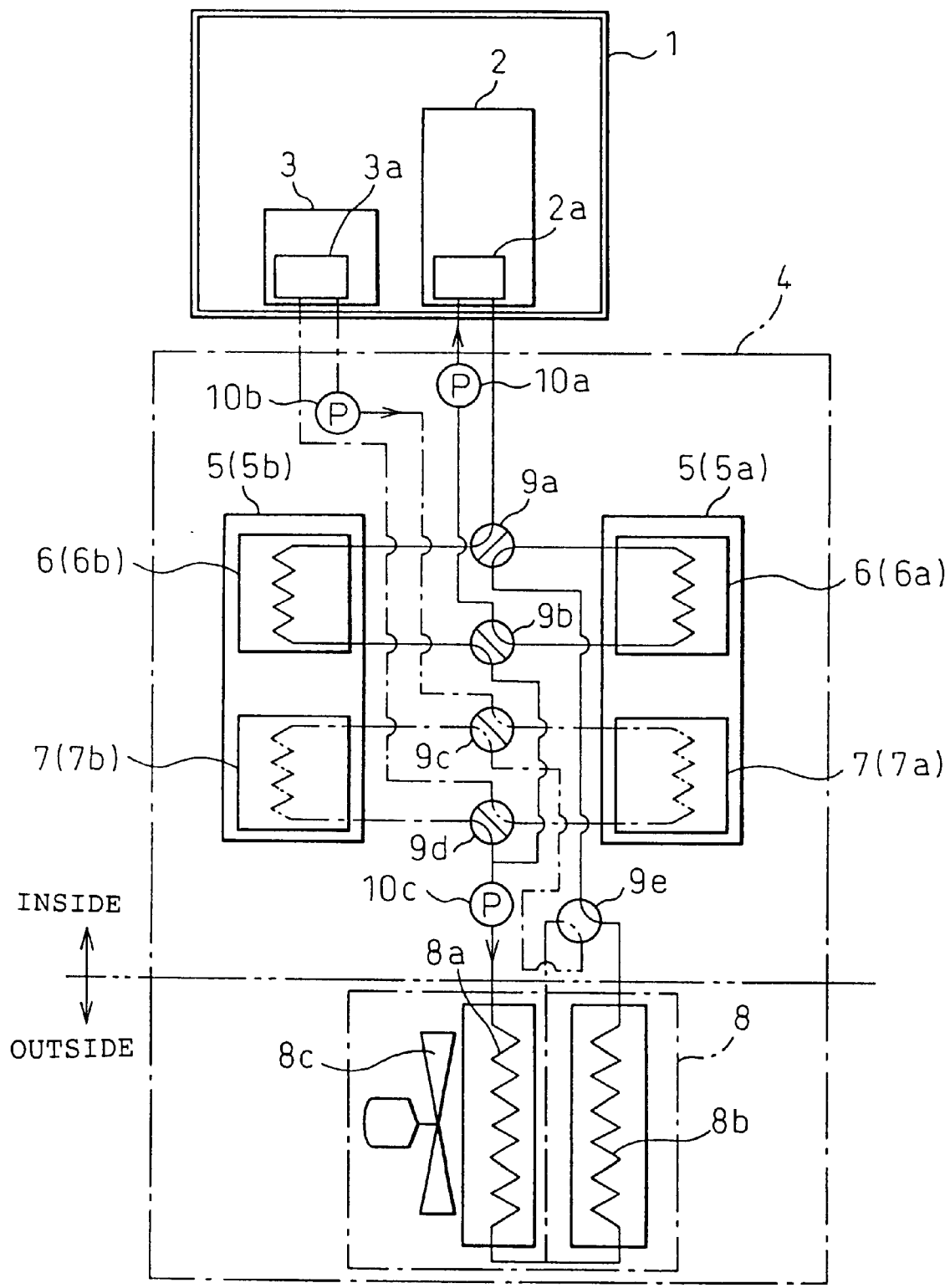
FIG. 5 is a schematic view of the flow of the heat medium in an excess heat-operating mode according to the first embodiment of the present invention.

Due to this, as shown in FIGS. 4 and 5, the heat absorbed in the heat medium in the first heat collector 2a is discharged to the outside air from the outdoor unit 8 without being supplied to the adsorbent in the refrigerator 4.

Note that the time during which the excess heat-operating mode is used is suitably selected based on the amount of emission of heat of the first heat emitter 2, the amount of heat which can be absorbed by the adsorbent of the refrigerator 4, the temperature of the outside air, etc.

Note that FIG. 4 shows the excess heat operating mode used when shifting from the first basic operating mode to the second basic operating mode, while FIG. 5 shows the excess heat-operating mode executed when shifting from the second basic operating mode to the first basic operating mode.

3. Insufficient Heat Operating Mode

This mode is used when the amount of emission of heat of the first heat emitter 2 falls below a predetermined amount of heat required for operation of the refrigerator (for example, the minimum refrigerating capacity of the refrigerator 4 divided by the minimum coefficient of performance (COP) of the refrigerator 4).

Specifically, when switching between the first basic operating mode and the second basic operating mode, the valve 9a for switching the heat medium inlet side of the first heat exchanger 6 is made to operate before the valve 9b for switching the heat medium outlet side of the first heat exchanger 6, then the valve 9b is operated after the elapse of a predetermined time.

Figure 6:
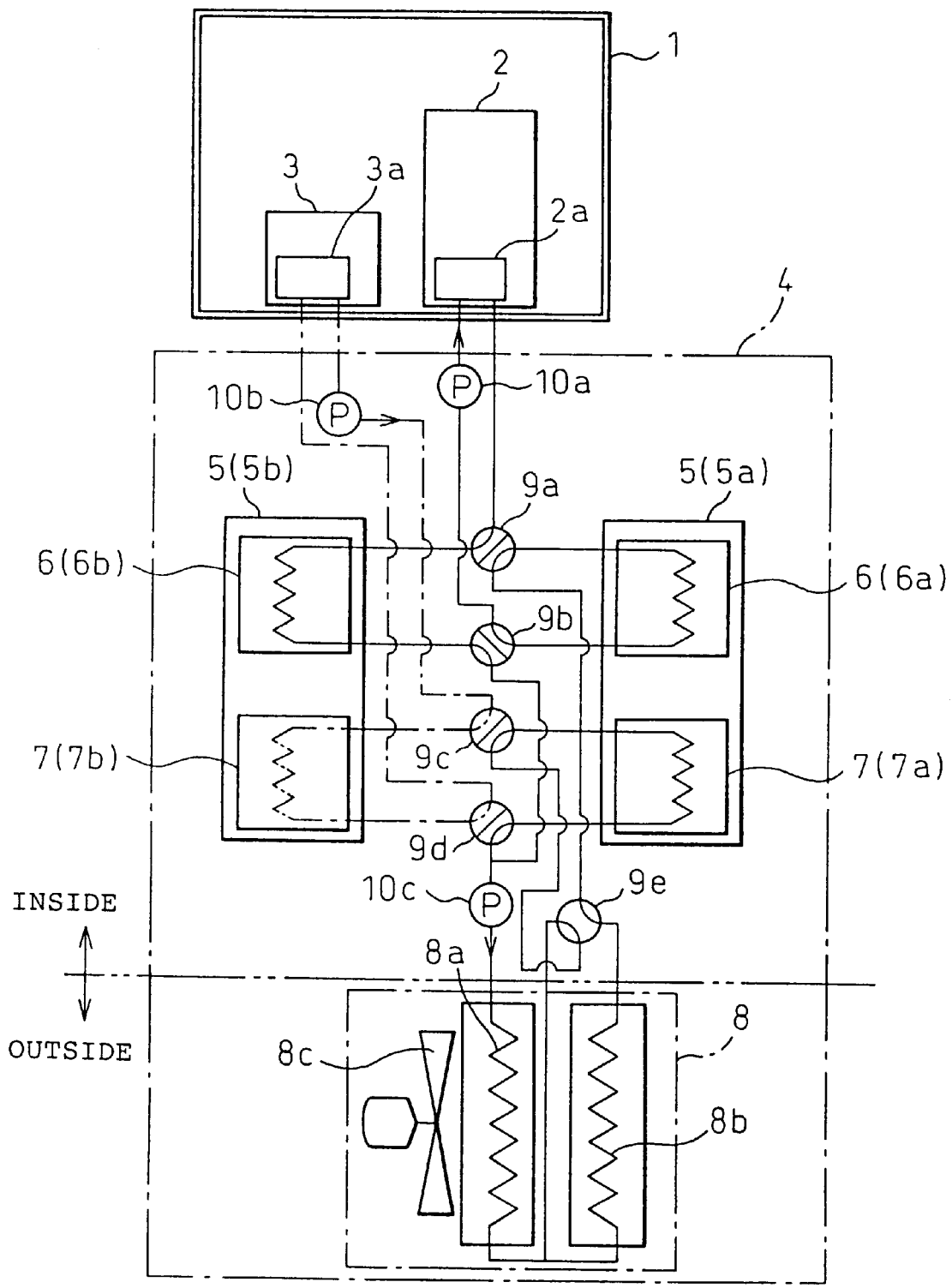
FIG. 6 is a schematic view of the flow of the heat medium in an insufficient heat operating mode according to the first embodiment of the present invention.
Figure 7:
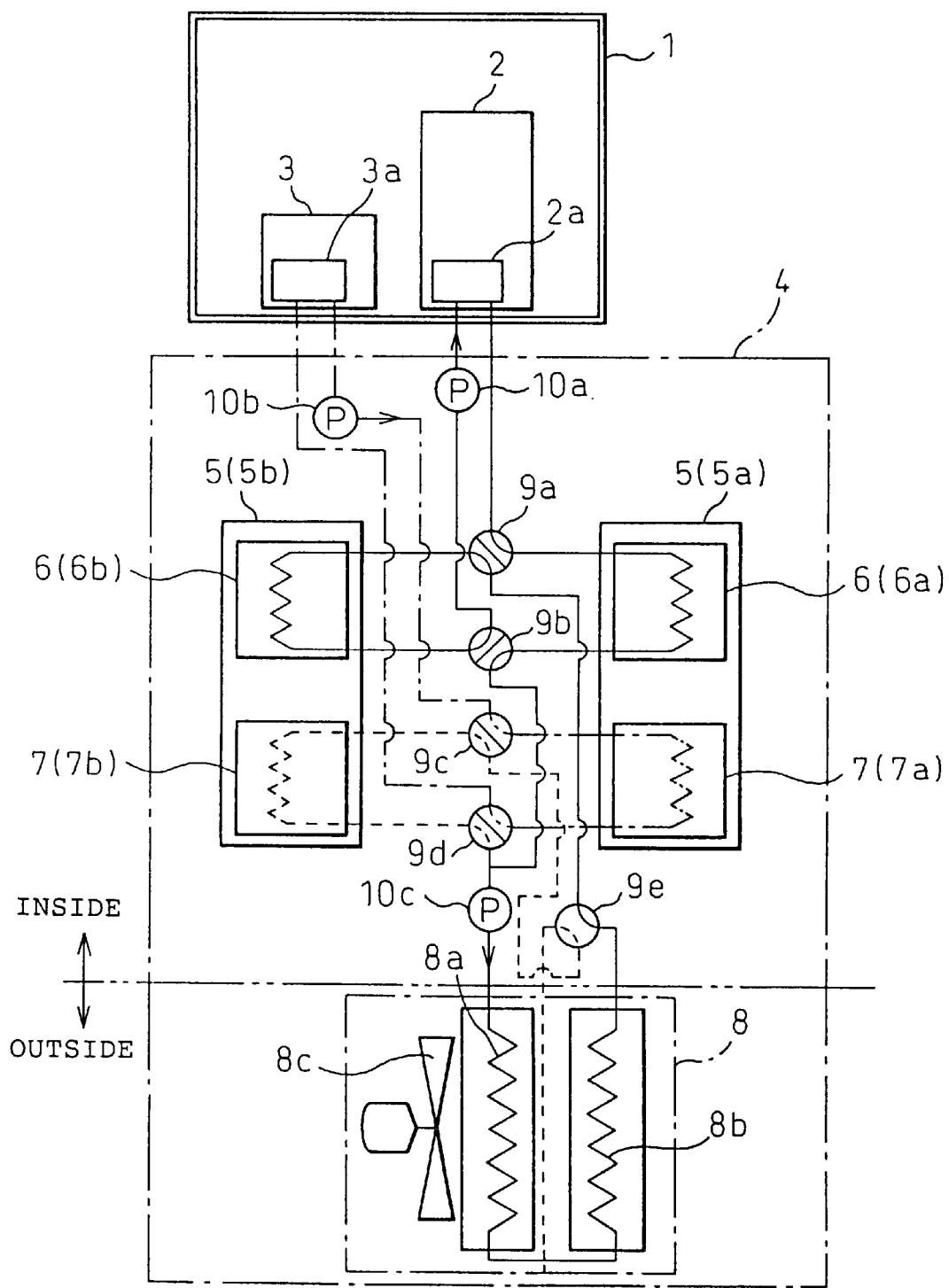
FIG. 7 is a schematic view of the flow of the heat medium in an insufficient heat-operating mode according to the first embodiment of the present invention.

Due to this, as shown in FIGS. 6 and 7, the heat medium which had been supplied to the first heat exchanger 6 for heating the adsorbent returns to the first heat collector 2a without flowing to the outdoor unit 8, so it is possible to supply the heat generated in the first heat emitter 2 to the refrigerator 4 without waste.

Note that the time during which the insufficient heat operating mode is executed is, in the same way as when the excess heat-operating mode is being used, suitably selected based on the amount of emission of heat of the first heat emitter 2, the amount of heat which can be absorbed by the adsorbent of the refrigerator 4, the temperature of the outside air, etc.

Note that FIG. 6 shows the insufficient heat-operating mode used when shifting from the first basic operating mode to the second basic operating mode, while FIG. 7 shows the insufficient heat operating mode used when shifting from the second basic operating mode to the first basic operating mode.

4. Direct Cooling Mode

Figure 8:
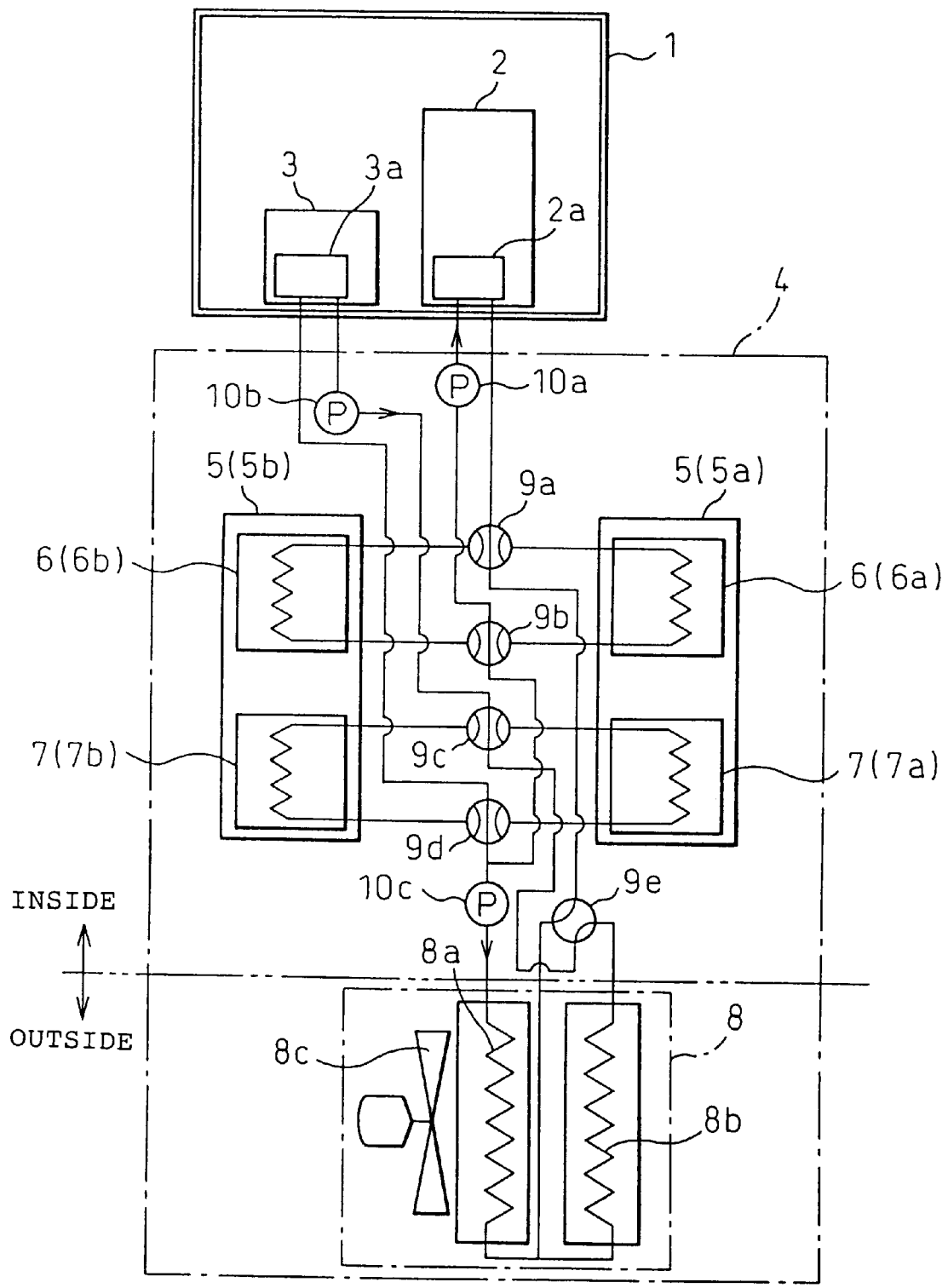
FIG. 8 is a schematic view of the flow of the heat medium in a direct cooling mode according to the first embodiment of the present invention.

This mode is used when the temperature of the outside air becomes sufficiently low in the winter season etc. and the temperature of the outside air is lower than the cooling temperature of the second heat emitter 3 (allowable heat resistance temperature of the second heat emitter 3) or when the refrigerator 4 breaks down. In this case, as shown in FIG. 8, the pumps 10a and 10b are stopped, the first heat emitter 2 (first heat collector 2a) is supplied with the heat medium cooled by only the first radiator 8a, and the second heat emitter 3 (second heat collector 3a) is supplied with the heat medium cooled by the first radiator 8a and the second radiator 8b.

Note that the temperature of the outside air is detected by a not shown outside air temperature sensor (outside air temperature detecting means). In the present embodiment, this mode is used when the detection value becomes less than 15° C.

Further, as to the judgement as to whether the refrigerator 4 has broken down, it is deemed that the refrigerator 4 has broken down in any of the following cases: when the pressure inside an absorber 5 becomes more than a predetermined value (in the present embodiment, 70 kPa), when the temperature of the heat medium flowing out from the second heat exchanger 7 of an absorber 5 in the adsorption step becomes more than a predetermined value (in the present embodiment, 20° C.), when the temperature of the heat medium flowing out from the second heat exchanger 7 of an absorber 5 in the adsorption step becomes equal to the temperature of the heat medium at the inlet of the second heat exchanger 7, or when the temperature of the heat medium flowing into the first heat exchanger 6 of an absorber 5 and the temperature of the heat medium flowing out from the first heat exchanger 6 become equal.

Next, the characteristic features of the present embodiment will be explained.

The cooling system according to the present embodiment cools the second heat emitter 3 by an adsorption type refrigerator 4, which absorbs the heat from the first heat emitter 2 and operates by the absorbed heat, so can save power (save energy) and is suitable for continuous operation.

Further, complicated control is not required, so continuous operation is possible even in the absence of a manager for managing the base station.

First, when the amount of emission of heat of the first heat emitter 2 exceeds a predetermined amount of heat, the refrigerator 4 is controlled so that the heat absorbed in the heat medium by the first heat collector 2a is radiated to the outside air (radiated location) by the outdoor unit 8 without being supplied to the adsorbent of the refrigerator 4 and so that thereby the coefficient of performance (COP) of the refrigerator 4 falls. On the other hand, when the amount of emission of heat of the first heat emitter 2 falls below a predetermined amount of heat, the refrigerator 4 is controlled so that the heat medium which had been supplied to the first heat exchanger 6 for further heating the adsorbent is made to return to the first heat exchanger 2a without flowing to the outdoor unit 8 so as to improve the coefficient of performance (COP) of the refrigerator 4, so it is possible to flexibly deal with any fluctuation in the amount of emission of heat of the first heat generating medium 2.

Note that the "coefficient of performance" spoken of here generated in the first heat emitter 2 is the ratio (Q2/Q1) of the refrigerating capacity Q2 generated by the refrigerator 4 with respect to the amount of heat of the first heat collector Q1 and not the ratio (Q2/Q0) of the amount of heat Q0 actually consumed (absorbed) in the refrigerator 4 and the refrigerating capacity Q2 generated by the refrigerator 4.

Further, when the temperature of the outside air is sufficiently low such as in the winter season etc., the refrigerator 4 is not operated, but the heat of the two heat emitters 2 and 3 is discharged to the outside air, so it is possible to reduce the energy consumed for cooling the two heat emitters 2 and 3 (energy required for operating the pumps 10a and 10b).

If however the valve 9a for switching the heat medium inlet side of the first heat exchanger (adsorption core) 6 and the valve 9b for switching the heat medium outlet side of the first heat exchanger (adsorption core) 6 are simultaneously operated for switching, due to the effect of the heat capacity of the first heat exchanger (adsorption core) 6, the adsorbent of the refrigerator 4 cannot adsorb the gaseous phase refrigerant immediately after switching from the desorption step to the adsorption step and the substantive refrigerating capacity is liable to fall.

Therefore, in the present embodiment, the specifications of the refrigerator 4 are determined so that when switching the absorbers 5 from the desorption step to the adsorption step, even if simultaneously operating the valves 9a to 9d for switching the flow of the heat medium, the predetermined reference refrigerating capacity is generated by a predetermined reference amount of emission of heat in the first heat emitter 2.

Note that in the present embodiment, the heat medium flows back through the pumps 10a and 10b in the direct cooling mode, so the pressure loss in the pumps 10a and 10b becomes larger and the load of the pump 10c is liable to become larger. Therefore, it is possible to provide a bypass circuit for circulating the heat medium while bypassing the pumps 10a and 10b at the time of the direct cooling mode.

(Second Embodiment)

Figure 9:
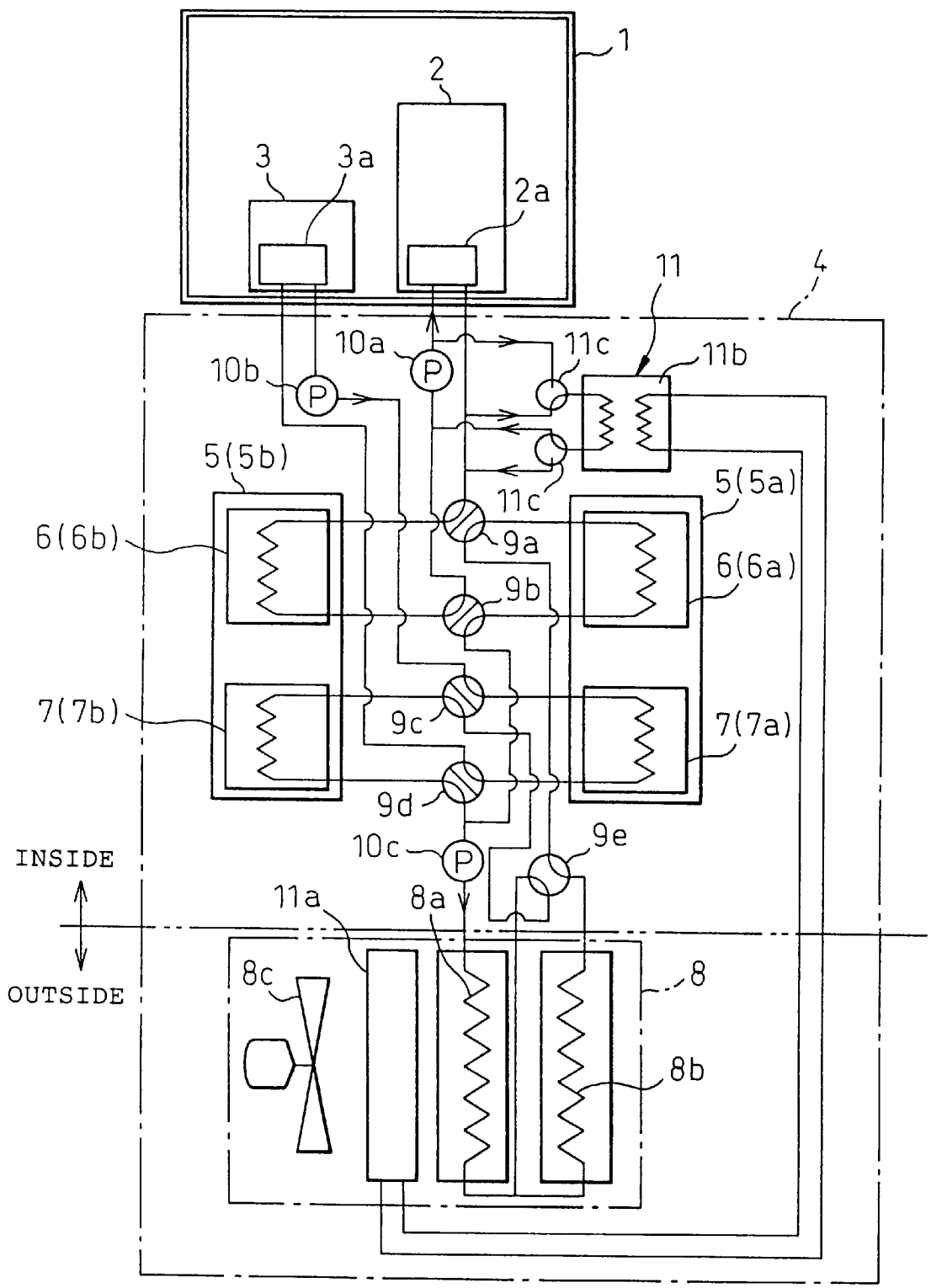
FIG. 9 is a schematic view of a cooling system according to a second embodiment of the present invention.

The present embodiment, as shown in FIG. 9, provides a second refrigerator (second cooling means) 11 in the circuit through which the heat medium absorbing the heat from the first heat emitter 2 circulates in addition to the refrigerator 4 (hereinafter referred to as the "first refrigerator 4").

Note that in the present embodiment, a vapor compression type refrigerator is used as the second refrigeratory 11. In FIG. 9, 11a is an outdoor unit exchanging heat between the outside air and the refrigerant circulating through the second refrigerator 11, 11b is an indoor unit for exchanging heat between the heat medium absorbing heat from the first heat emitter 2 and the refrigerant circulating through the second refrigerator 11, and 11c is a valve for switching the path through which the heat medium flows.

Further, when the amount of emission of heat of the first heat emitter 2 becomes excessively great (for example, when the amount of emission of heat of the first heat emitter multiplied with the minimum coefficient of performance of the refrigerator 4 exceeds the refrigerating capacity required for cooling the second heat emitter 3), the valve 11c is placed in the state shown by the solid lines and the heat medium is cooled by the refrigerating capacity generated in the second refrigerator 11.

On the other hand, when the amount of emission of heat of the first heat emitter 2 becomes excessively small (for example, when the amount of emission of heat of the first heat emitter multiplied with the minimum coefficient of performance of the refrigerator 4 falls lower than the refrigerating capacity required for cooling the second heat emitter 3), the valve 11c is placed in the state shown by the broken lines and the second refrigerator 10 is operated as a heat pump. Due to this, the amount of heat absorbed from the outside air and the amount of heat corresponding to the work of compression of the compressor are deemed the amount of heat of the auxiliary heat source to be given to the heat medium and the amount of heat required for operating the first refrigerator 4 is supplemented.

Due to this, it is possible to operate the first refrigerator 4 and stably cool the heat emitters 2 and 3 without relying on only the amount of emission of heat of the first heat emitter 2.

Note that in the present embodiment, the example was given of using a vapor compression type refrigerator as the second refrigerator 11, but the present embodiment is not limited to this. It is also possible to use as the second refrigerator 11 a gas refrigerator, a thermoelectric refrigerator, a heat syphon, or another refrigerator. Further, it is possible to configure the second refrigerator (cooling means) by using a simple heat exchanger such as a radiator and circulating the refrigerant without changing it in phase.

(Third Embodiment)

Figure 10:
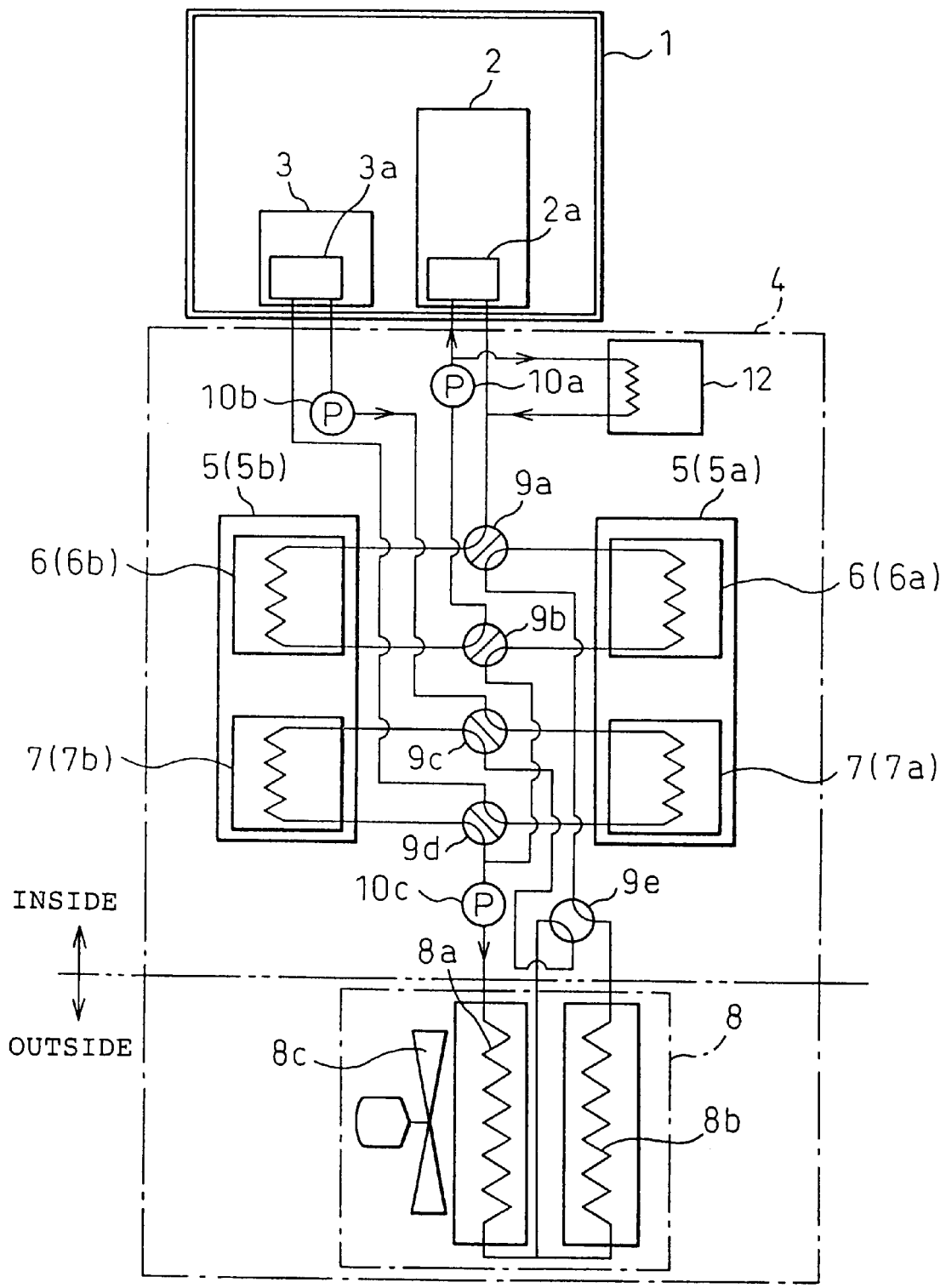
FIG. 10 is a schematic view of a cooling system according to a third embodiment of the present invention.

The present embodiment, as shown in FIG. 10, provides an auxiliary heat source (in this embodiment, an electric heater) 12 for further heating the heat medium in the circuit through which the heat medium absorbing heat from the first heat emitter 1 circulates.

Further, when the amount of emission of heat of the first heat emitter 2 becomes excessively small (for example, when the amount of emission of heat of the first heat emitter multiplied with the coefficient of performance of the refrigerator 4 falls lower than the refrigerating capacity required for cooling the second heat emitter 3), the auxiliary heat source 12 further heats the heat medium to supplement the amount of heat required for operating the first refrigerator 2.

Note that in the present embodiment, an electric heater was used as the auxiliary heat source 12, but the present invention is not limited to this. It is also possible to use a combustion type heater, a cooling system of an internal combustion engine or other engine generating waste heat, the first refrigerator 4 when using a system of a type generating waste heat, an accumulator, a solar heat collector, etc.

(Fourth Embodiment)

Figure 11:
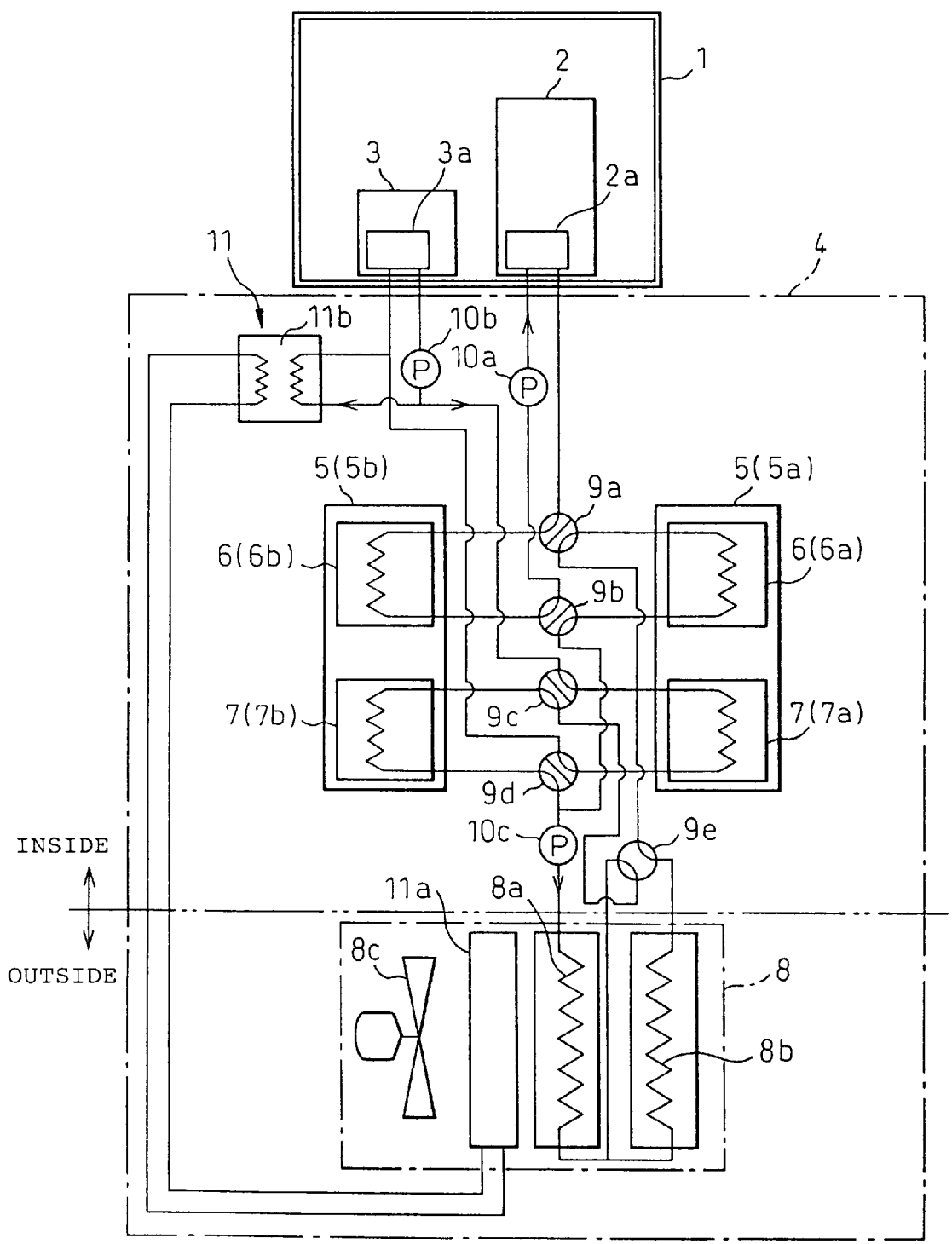
FIG. 11 is a schematic view of a cooling system according to a fourth embodiment of the present invention.

The present embodiment, as shown in FIG. 11, provides a second refrigerator 11 in the circuit through which the heat medium absorbing heat from the second heat emitter 2 circulates.

Further, when the refrigerating capacity required for cooling the second heat emitter 3 is not available (for example, when the amount of emission of heat of the first heat emitter multiplied with the coefficient of performance of the first refrigerator 4 falls lower than the refrigerating capacity required for cooling the second heat emitter 3), the heat medium (supplied to the second heat emitter 3) is cooled by the second refrigerator 11.

At this time, since the second refrigerator 11 exhibits a refrigerating capacity independently without absorbing heat from the first heat emitter 2, it can reliably cool the second heat emitter 3.

(Fifth Embodiment)

Figure 12:
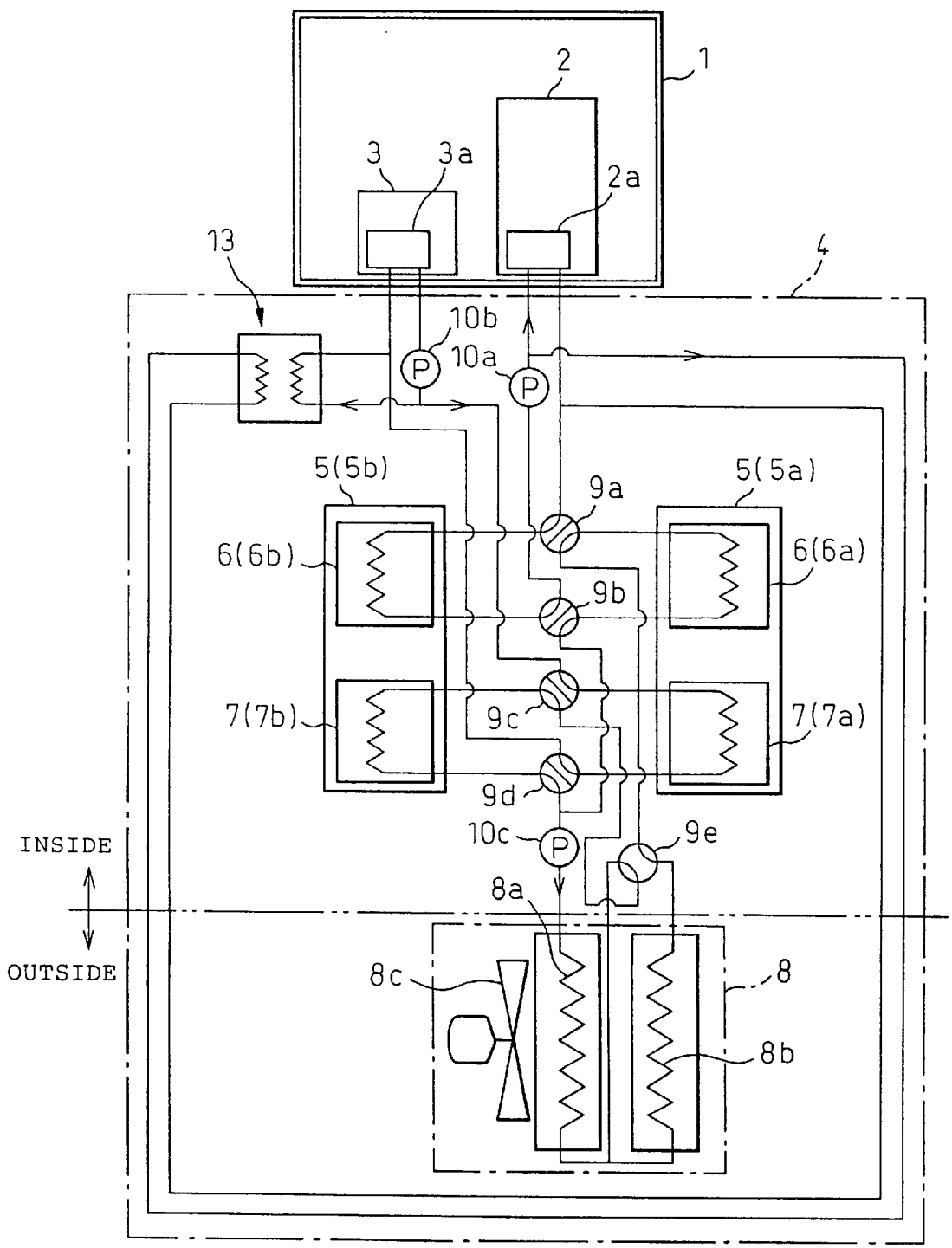
FIG. 12 is a schematic view of a cooling system according to a fifth embodiment of the present invention.

In the first embodiment, heat was absorbed from only the first heat emitter 2 to operate the adsorption type refrigerator 4, but the present embodiment, as shown in FIG. 12, is characterized in the point of absorbing heat not only from the first heat emitter 2, but also the second heat emitter 3 to operate the adsorption type refrigerator 4.

Note that reference numeral 13 is a heat exchanger absorbing the heat from the heat medium heated by the second heat emitter 3 (second heat collector 3a) and heating a heat medium circulating through the first heat emitter 2 (first heat collector 2a).

Due to this, even when the refrigerating capacity required for cooling the second heat emitter 3 is not available (for example, when the amount of emission of heat of the first heat emitter multiplied with the coefficient of performance of the first refrigerator 4 falls lower than the refrigerating capacity required for cooling the second heat emitter 3) or when the amount of emission of heat of the first heat emitter 2 becomes excessively small (for example, when the amount of emission of heat of the first heat emitter 2 multiplied with the minimum coefficient of performance of the refrigerator 4 falls lower than the refrigerating capacity required for cooling the second heat emitter 3), it is possible to reliably cool the two heat emitters 2 and 3.

(Sixth Embodiment)

Figure 13:
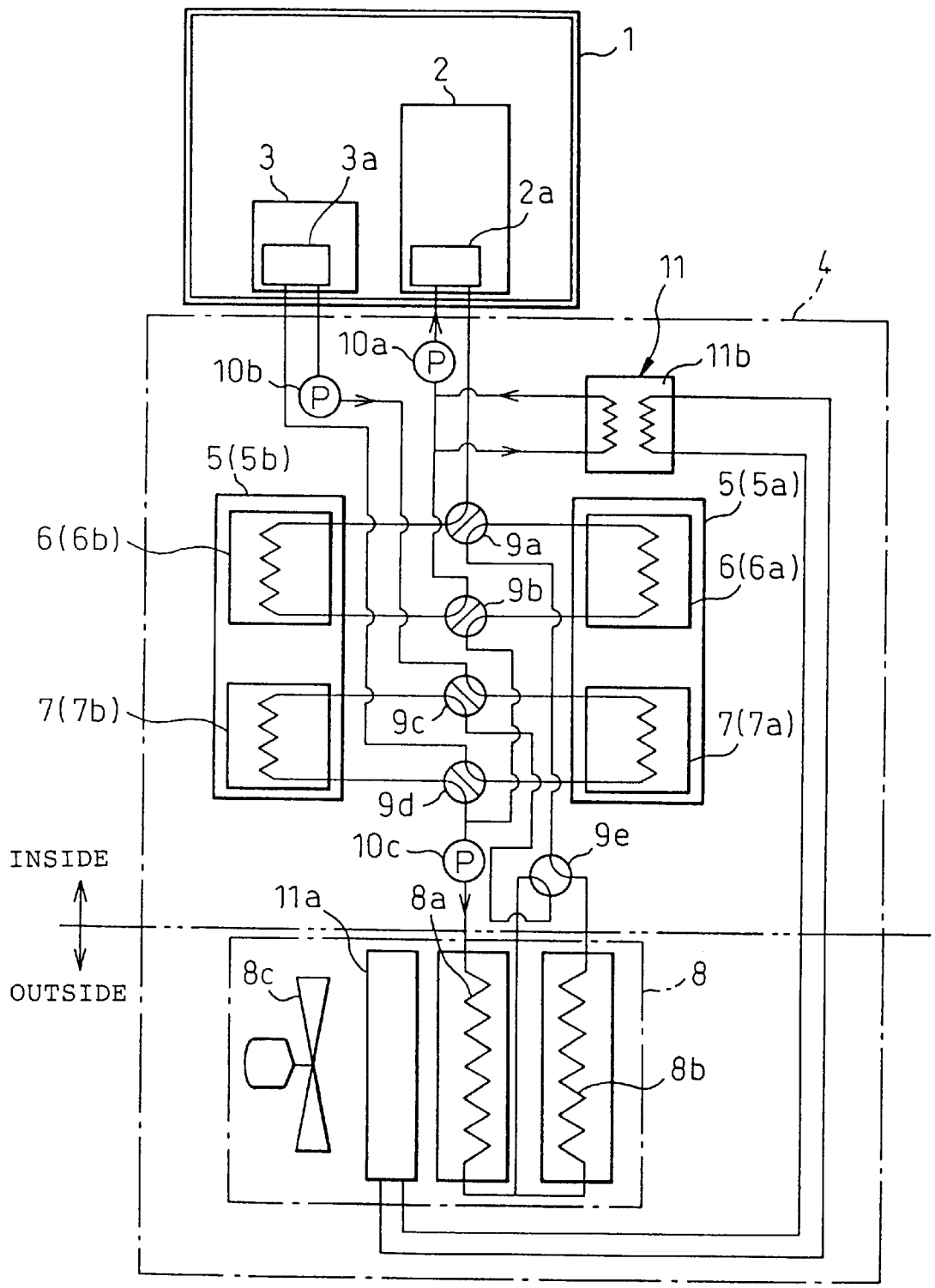
FIG. 13 is a schematic view of a cooling system according to a sixth embodiment of the present invention.

The present embodiment, as shown in FIG. 13, corresponds to the cooling system according to the second embodiment (see FIG. 9) minus the pump 11c. Note that in FIG. 13, the inlet side of the heat medium to the second refrigerator 11 (indoor unit 11b) and the outlet side of the heat medium are connected to the suction side of the pump 10a, but it is also possible to connect these to the discharge side of the pump 10a.

Due to this, in the same way as in the second embodiment, it is possible to stably cool the heat emitters 2 and 3 without relying on only the amount of emission of heat of the first heat emitter 2.

(Seventh Embodiment)

Figure 14:
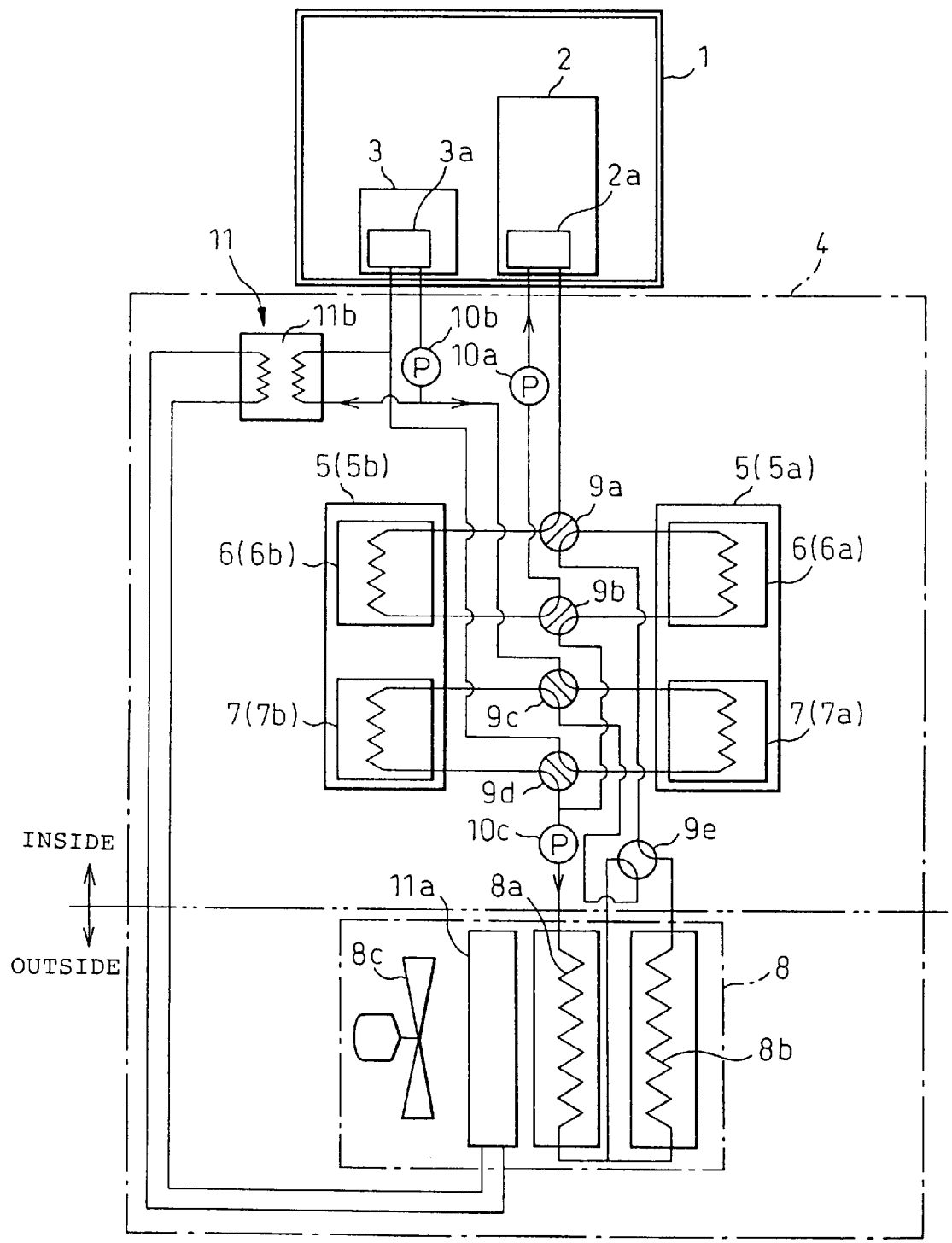
FIG. 14 is a schematic view of a cooling system according to a seventh embodiment of the present invention.

In the above fourth embodiment (see FIG. 11), the second refrigerator 11 was provided at the discharge side of the pump 10b, but the present embodiment, as shown in FIG. 14, provides the second refrigerator 11 at the suction side of the pump 10b.

Due to this, in the same way as in the fourth embodiment, even when the refrigerating capacity required for cooling the second heat emitter 3 is not available (for example, when the amount of emission of heat of the first heat emitter 2 multiplied with the coefficient of performance of the first refrigerator 4 falls under the refrigerating capacity required for cooling the second heat emitter 3), the second heat emitter 3 can be cooled.

(Eighth Embodiment)

Figure 15:
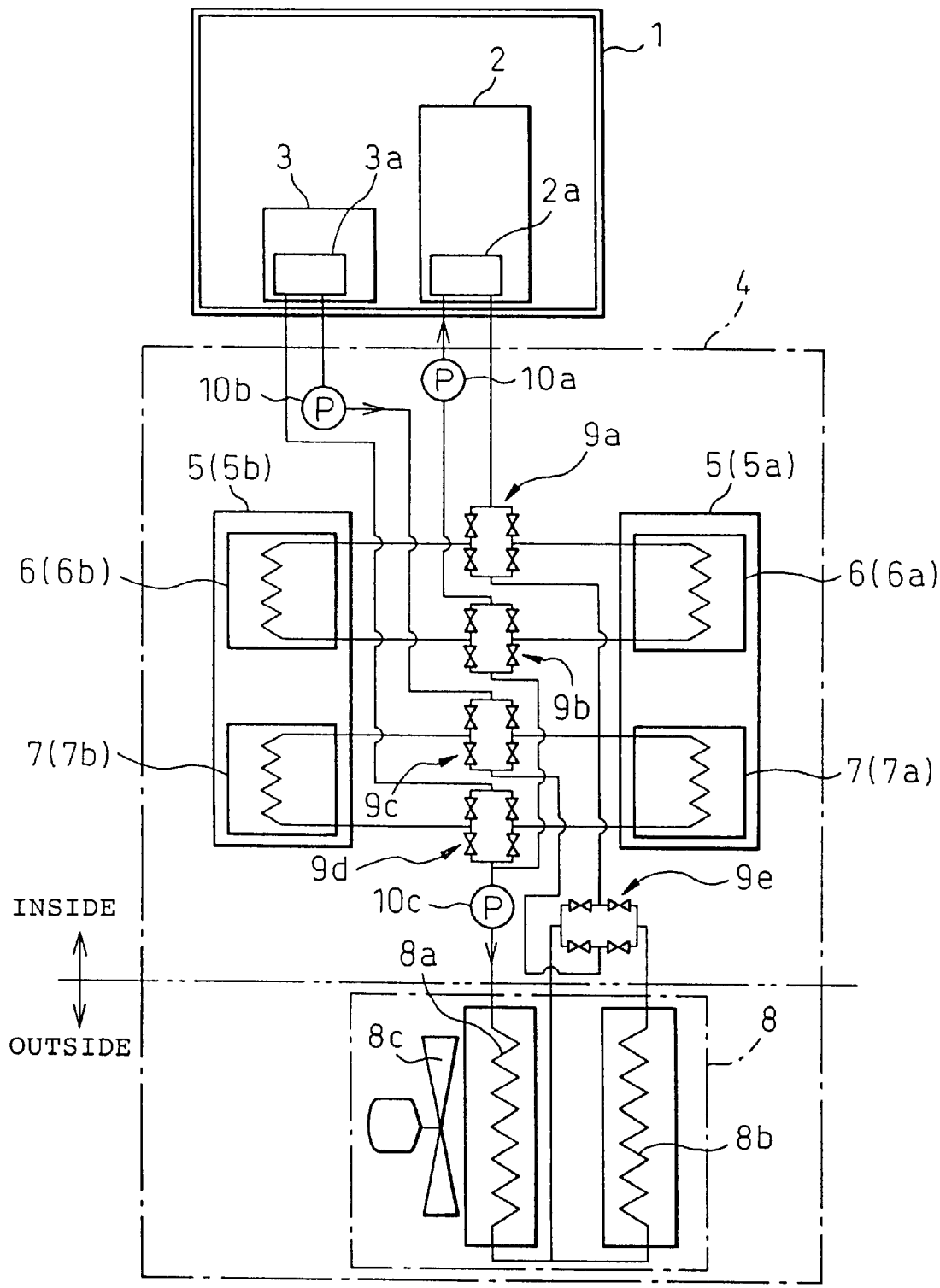
FIG. 15 is a schematic view of a cooling system according to an eighth embodiment of the present invention.

In the above embodiments, rotary type valves were used as the valves for switching the flow path of the heat medium, but the present embodiment, as shown in FIG. 15, uses a plurality of two-way valves (switching valves) to configure valves 9a to 9e having functions similar to those of rotary type valves.

(Ninth Embodiment)

Figure 16:
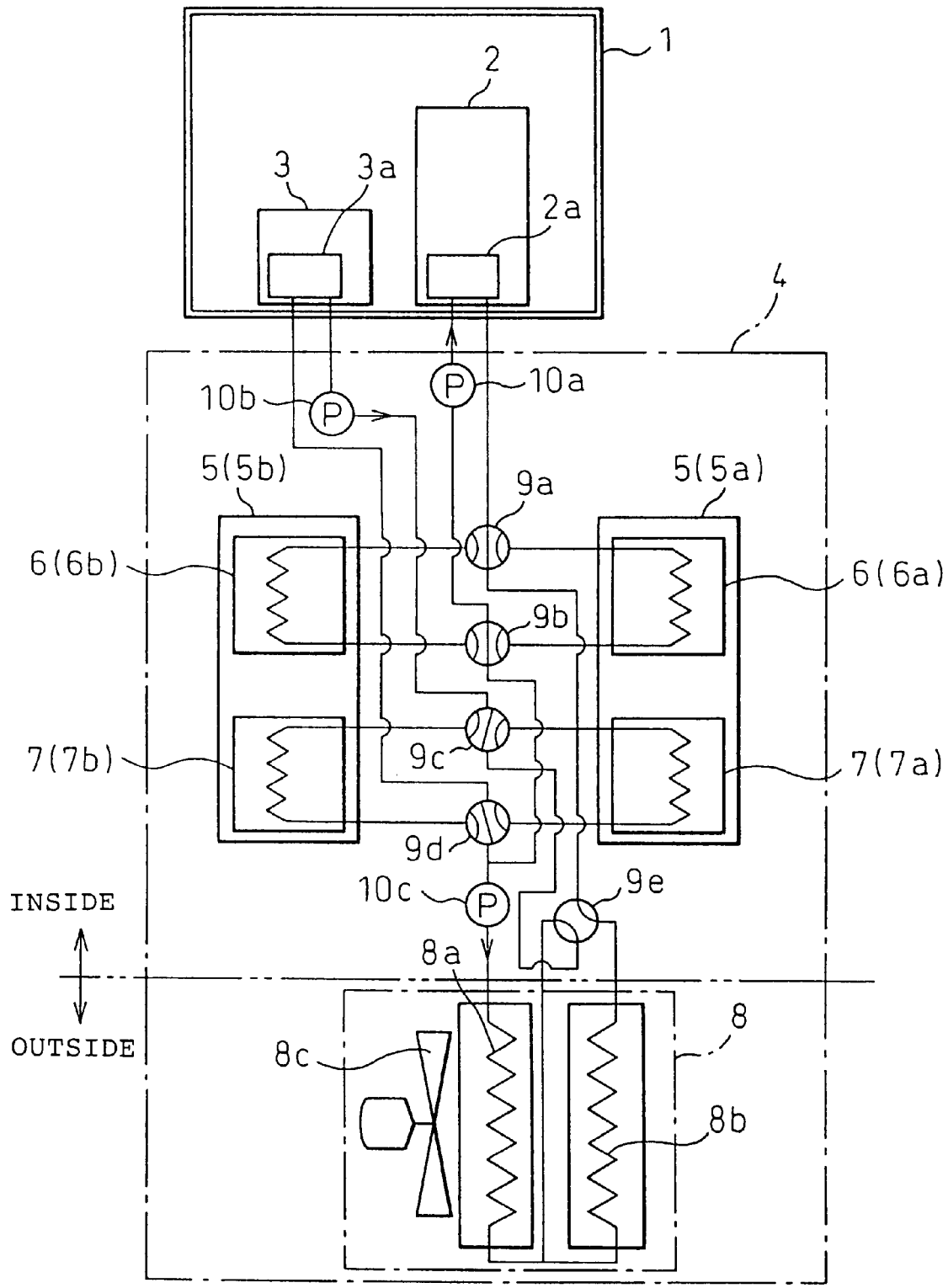
FIG. 16 is a schematic view of a cooling system according to a ninth embodiment of the present invention.

The present embodiment, as shown in FIG. 16, is designed to discharge the heat of one of the first heat emitter 2 and the second heat emitter 3 (in this example, the heat of the first heat emitter 2) directly from the outdoor unit 8 without going through the first refrigerator 4 when the temperature of the outside air becomes sufficiently low in the winter season etc. and the temperature of the outside air is lower than even the cooled temperature of the second heat emitter 3 (allowable heat resistance temperature of second heat emitter 3) or when the refrigerator 4 breaks down (direct cooling mode).

Note that only naturally, in the present embodiment, it is also possible to discharge the heat of both of the first heat emitter 2 and the second heat emitter 3 directly to the radiated location (in the outside air) without going through the first refrigerator 4.

(10th Embodiment)

Figure 17:
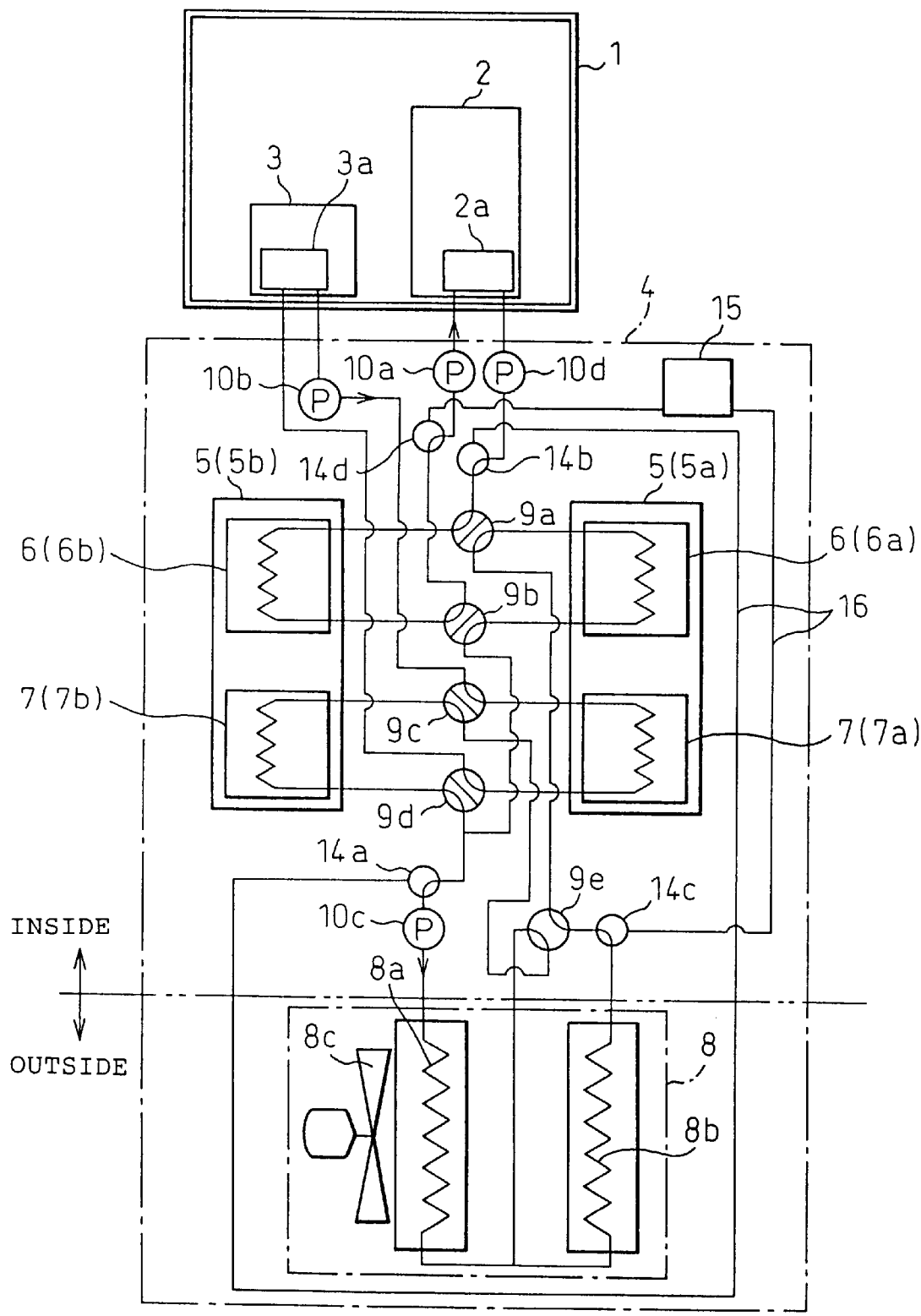
FIG. 17 is a schematic view of a cooling system according to a 10th embodiment of the present invention.

FIG. 17 is a schematic view of a cooling system according to the present embodiment. The present embodiment differs from the first embodiment (FIG. 1) in being provided with a bypass circuit 16 for causing the heat medium heated at the first heat collector 2a to bypass the valves 9a to 9e and leading it directly to the outdoor unit 8, three-way valves (hereinafter abbreviated as "valves") 14a to 14d for controlling switching between a case of circulating the heat medium to the bypass circuit 16 and a case of not circulating it there, a reserve tank 15 for replenishing the heat medium, and an emergency pump 10d.

Note that the pump 10d differs from the pumps 10a to 10c in that it is set to receive the supply of power from an emergency power source so that it can operate even in a blackout.

Next, the characterizing action and the effects of the present embodiment will be explained.

When the valves 9a to 9e malfunction due to some reason or another, the valves 14a to 14d are operated to lead the heat medium heated at the first heat collector 2a through the bypass circuit 16 directly to the outdoor unit 8 and cool the first heat emitter 2.

Due to this, even if the valves 9a to 9e malfunction, it is possible to cool the first heat emitter 2, so the reliability of the cooling system can be improved.

Further, since a reserve tank 15 for supplying the heat medium is provided, even if a leak of the heat medium occurs at some portion of the heat medium piping, since heat medium is supplied from the reserve tank 15, it is possible to prevent the cooling system from ending up stopping early and possible to improve the reliability of the cooling system.

Note that, not limited to the present embodiment, it is possible to configure the system so that the occurrence of a malfunction is automatically transmitted to a management company etc. managing the cooling system by a communicating means such as a telephone line when a malfunction occurs in a device in the cooling system. Therefore, when a malfunction occurs, it is possible for a serviceman to repair the cooling system, which malfunctioned.

Figure 18:
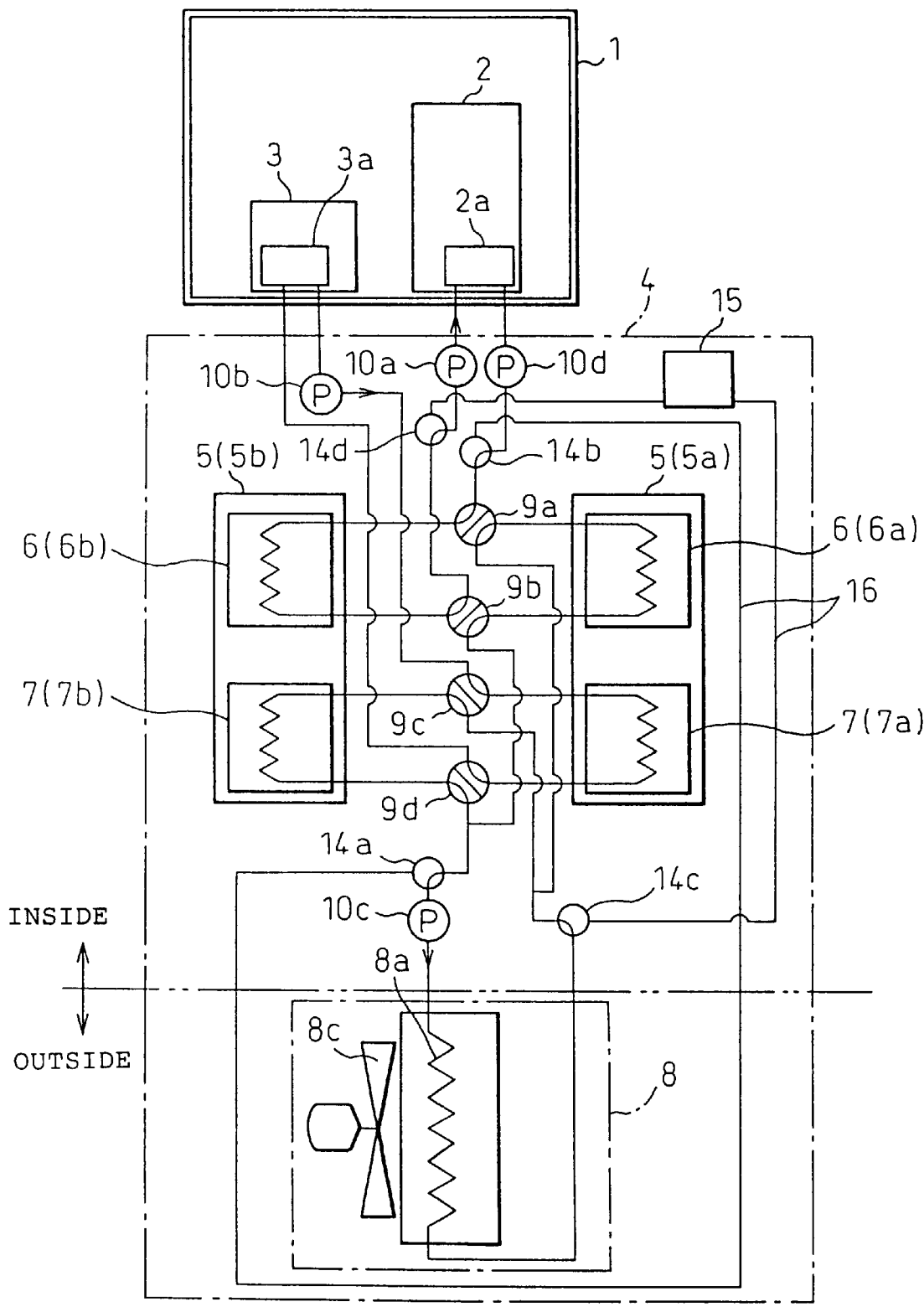
FIG. 18 is a schematic view of a cooling system according to a modification of the 10th embodiment of the present invention.

Note that in FIG. 17, the outdoor unit 8 is configured by first and second radiators 8a and 8b, but as shown in FIG. 18, it is also possible to configure the outdoor unit 9 by a single radiator 8a.

(11th Embodiment)

Figure 19:
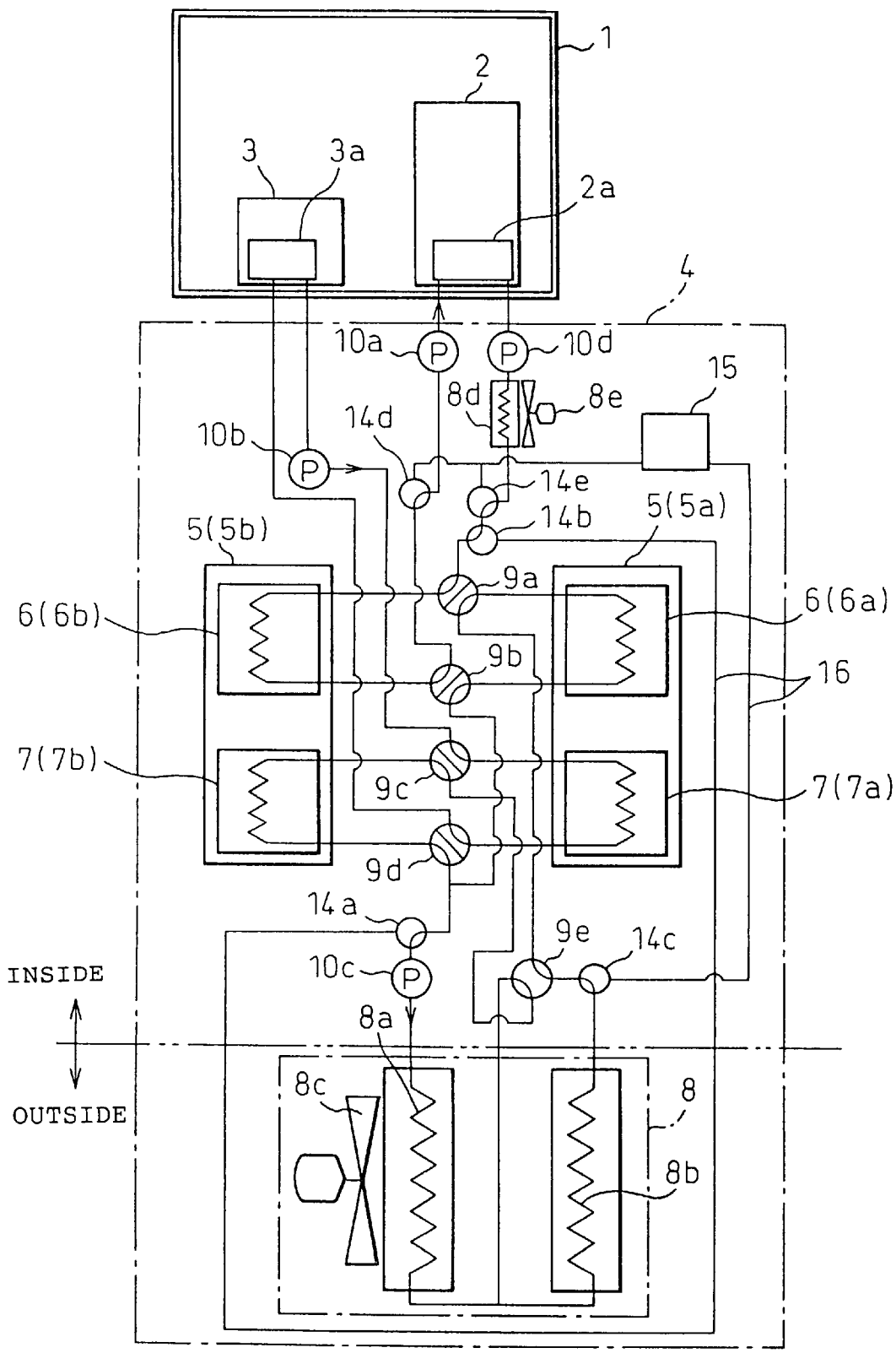
FIG. 19 is a schematic view of a cooling system according to an 11th embodiment of the present invention.

The present embodiment devises steps for when the outdoor unit 8 malfunctions. Specifically, unlike the 10th embodiment (FIG. 17), as shown in FIG. 19, it adds an emergency radiator 8a and a fan 8e for blowing cooling air to the radiator 8d and a valve 14e for circulating the heat medium to the radiator 8d bypassing the outdoor unit 8.

Due to this, even if heat cannot be radiated by the outdoor unit 8, it can be radiated by the radiator 8d, so the reliability of the cooling system can be raised much more. Note that the present embodiment of course includes all functions shown in the 10th embodiment.

Note that the present embodiment, like the modification of the 10th embodiment (FIG. 18), can configure the outdoor unit 8 by a single radiator 8a.

(12th Embodiment)

The present embodiment is similar to the above embodiments except that even when either of the first and second absorbers 5a and 5b starts malfunctioning, it is made possible to operate the refrigerator 4 by the other normally operating absorber 5.

Due to this, while the refrigerator 4 cannot be operated continuously (is operated intermittently), it is possible to prevent the refrigerator from ending up completely stopping, so it is possible to improve the reliability of the cooling system.

Figure 20:
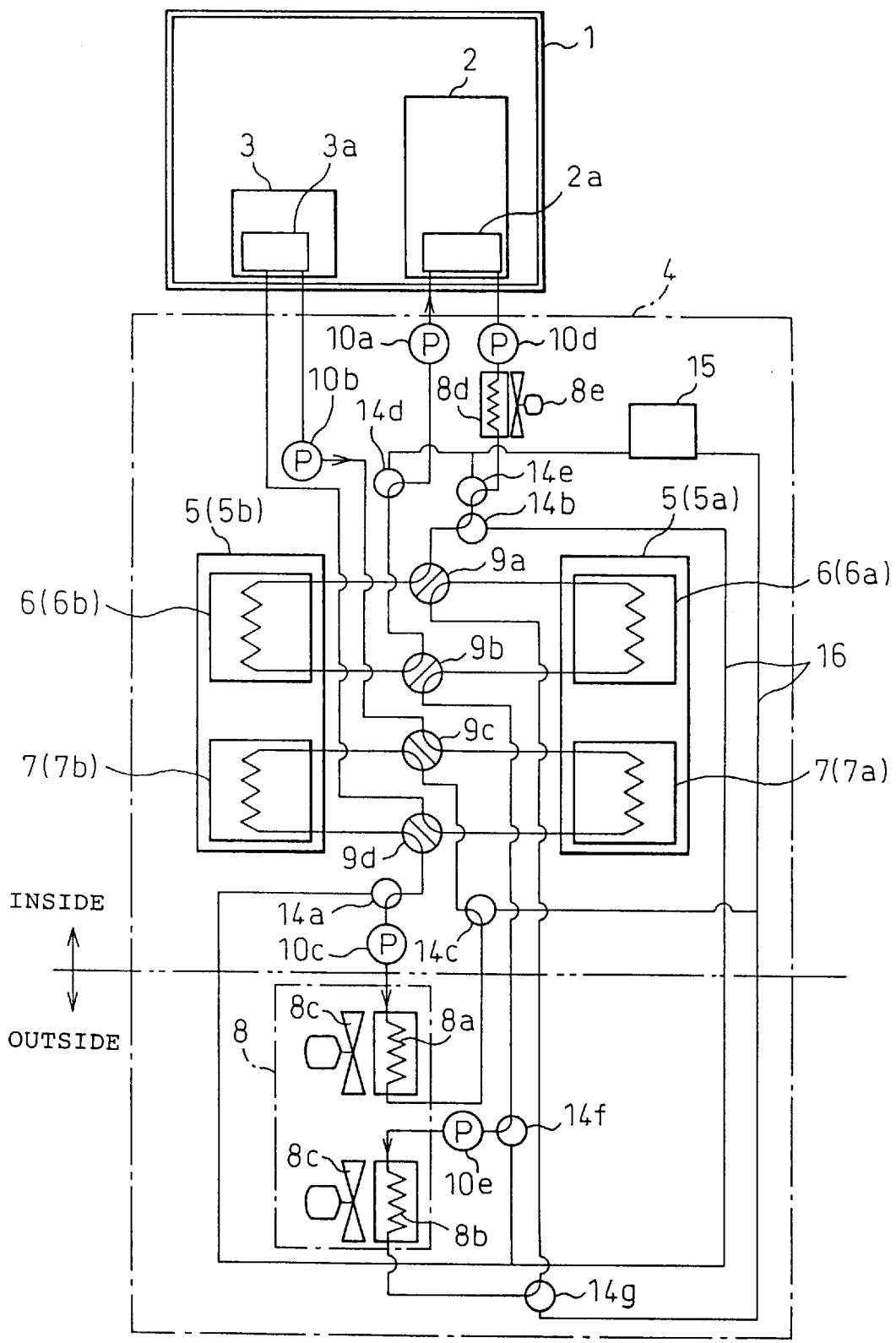
FIG. 20 is a schematic view of a cooling system according to a 12th embodiment of the present invention.

Further, in the present embodiment, as shown in FIG. 20, valves 14f and 14g and a pump 10e are provided so as to enable the heat of the first heat emitter 2 (heat collected by the first heat collector 2a) and the heat of the second heat emitter 3 (heat collected by the second heat collector 3a) to be radiated by the first and second radiators 8a and 8b when the refrigerator 4 breaks down. Of course, the heat of the first heat emitter 1 may also be radiated by both of the first and second radiators 8a and 8b.

Further, the present embodiment includes all of the configurations shown in the 10th and 11th embodiments, so even when the refrigerator 4 is being operated intermittently (refrigerator 4 is in the desorption step), it is possible to discharge the heat of the second heat emitter 2 by the bypass circuit 16 directly from the outdoor unit 8 (one of the first and second radiators 8a and 8b). Therefore, even if the refrigerator 4 is being operated intermittently, it is possible to suppress a large reduction in the refrigerating capacity.

Further, when the refrigerator 4 is in the adsorption step, it is possible to discharge the heat corresponding to the heat of condensation generated from the adsorbent at the time of adsorption (heat of adsorption) and the heat of the second heat emitter 3 by the outdoor unit 8 (first and second radiators 8a and 8b).

(13th Embodiment)

Figure 21:
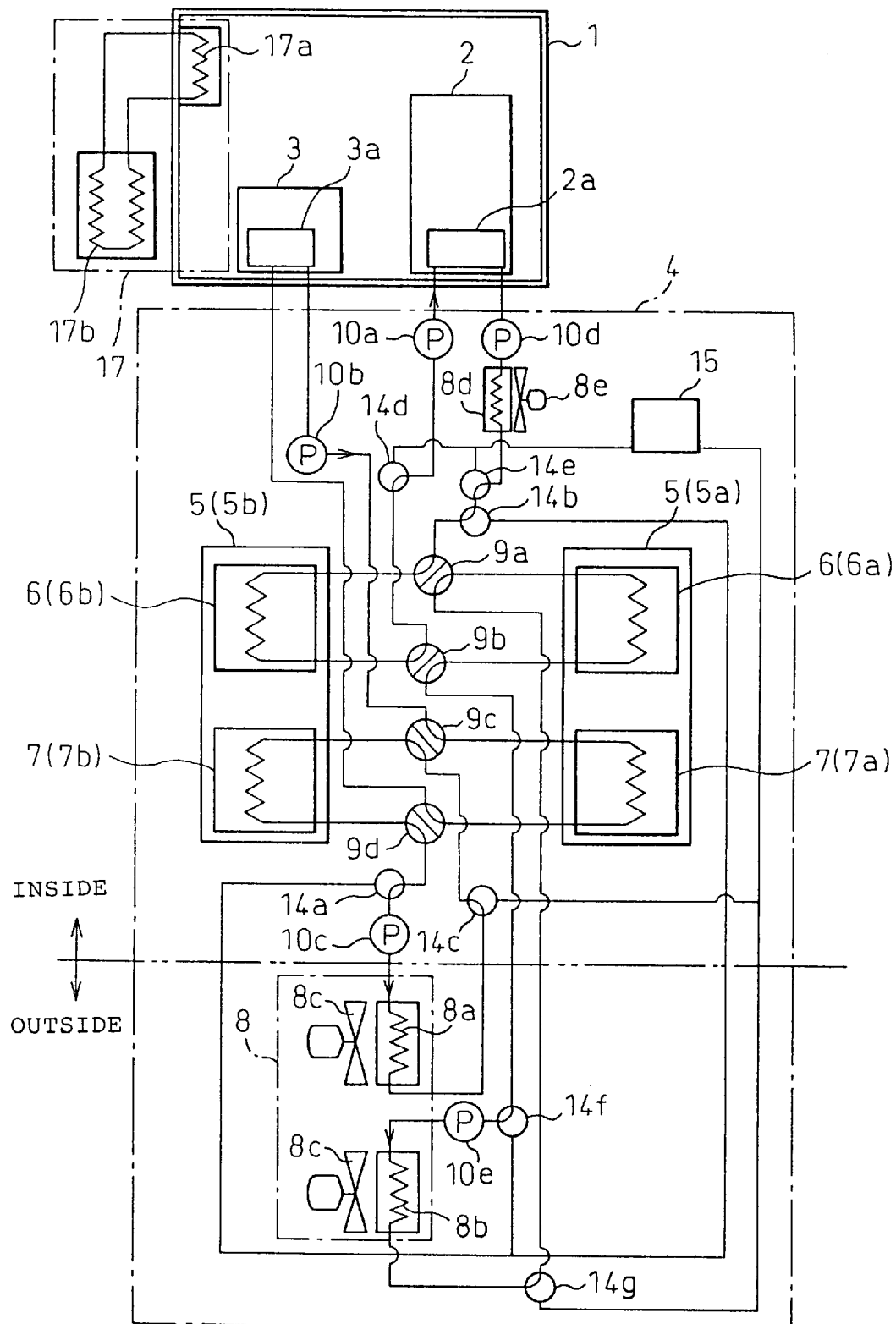
FIG. 21 is a schematic view of a cooling system according to a 13th embodiment of the present invention.

The present embodiment is similar to the 10th to 12th embodiments except that, as shown in FIG. 21, a third refrigerator (third cooling means) 17 independent from the refrigerator 4 is added.

Note that the third refrigerator 17 is comprised of an indoor unit 17a arranged inside the base station 1 and exchanging heat with the air inside the base station 1 and an outdoor unit 17b arranged outside of the base station 1 and discharging heat recovered by the indoor unit 17a to the outside of the base station 1 and may be of any type. For example, it is possible to use a vapor compression type refrigerator, a gas refrigerator, a thermoelectric refrigerator, a heat syphon, a water-cooling device, etc.

Due to this, it is possible to stably cool the first and second heat emitters 2 and 3 even if the amounts of emission of heat of the first and second heat emitters 2 and 3 fluctuate. Therefore, as explained in reference to the 11th embodiment, even if the refrigerating capacity of the refrigerator 4 falls, it is possible to cool the first and second heat emitters 2 and 3 stably.

Note that FIG. 21 is an example of application of the present embodiment to the 10th to 12th embodiments, but the present embodiment is not limited to the same. It may also be applied to the first to eighth embodiments.

(14th Embodiment)

Figure 22:
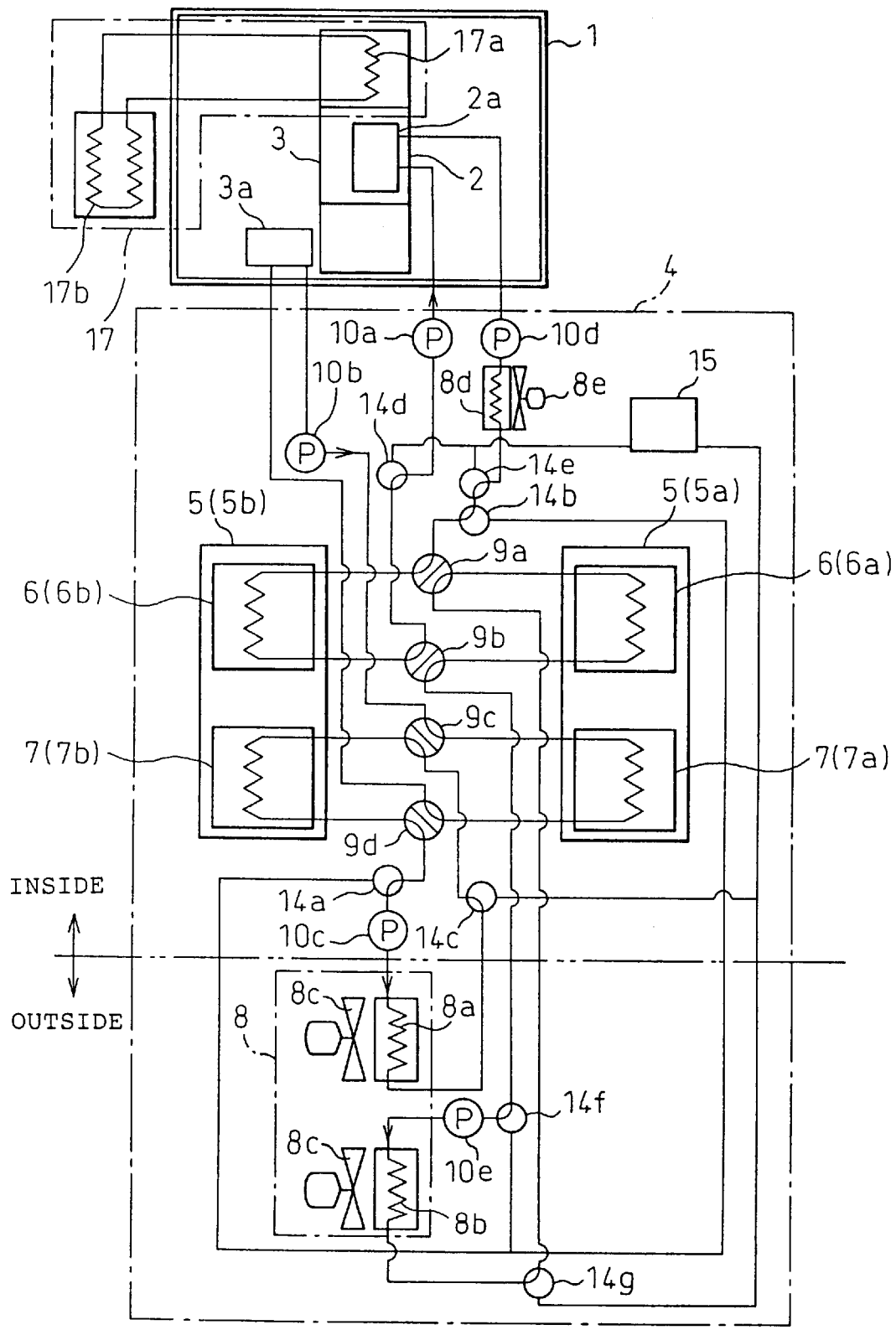
FIG. 22 is a schematic view of a cooling system according to a 14th embodiment of the present invention.

This embodiment is similar to the 13th embodiment except that, as shown in FIG. 22, the indoor device 17a is arranged immediately after the waste heat exhaust port of the first heat emitter 2.

Due to this, it is possible to discharge the waste heat quickly to the outside of the base station 1 before the inside of the base station 1 is heated by the high temperature waste heat, so it is possible to operate the refrigerator 4 and cooling system as a whole efficiently and stably.

(15th Embodiment)

Figure 23:
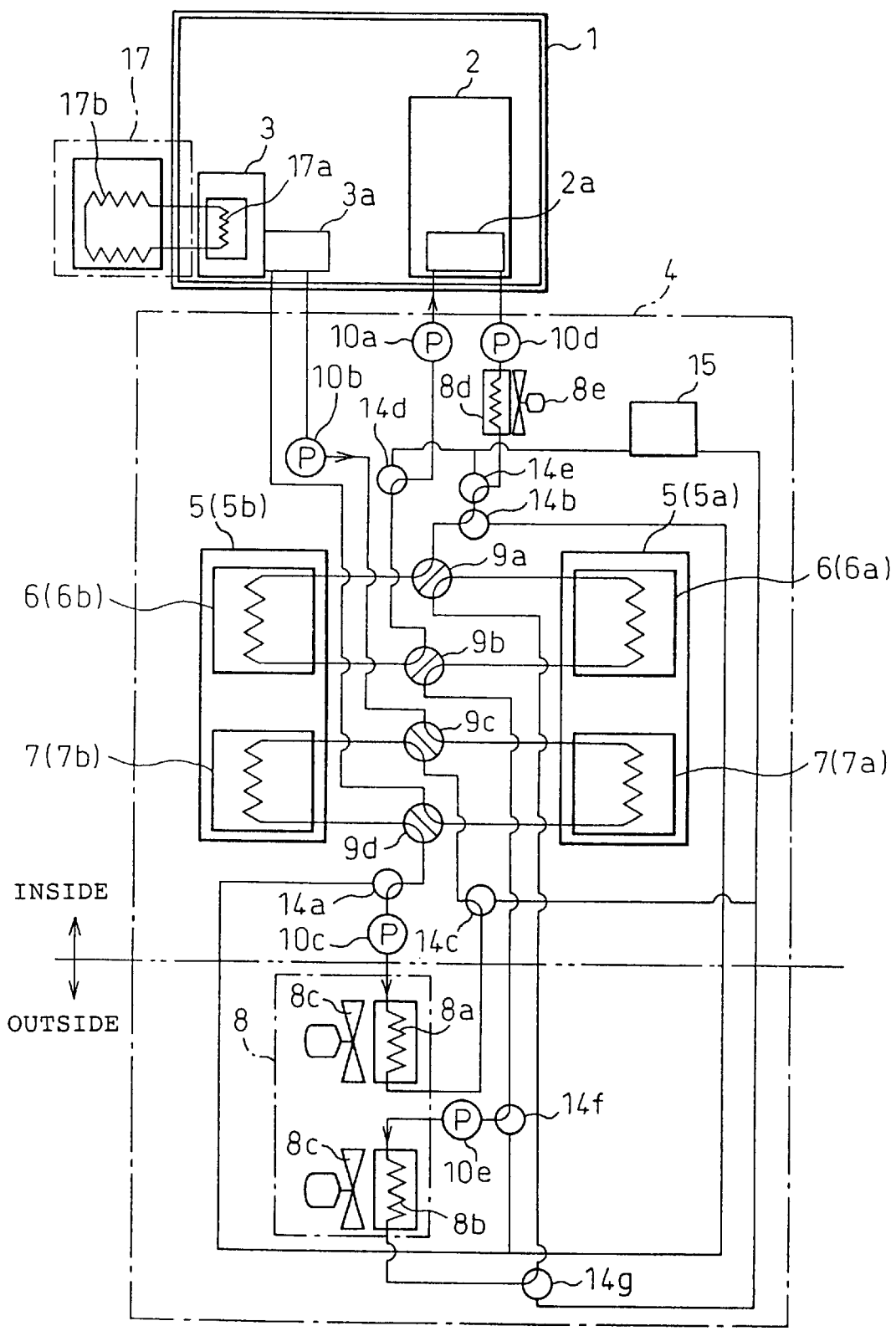
FIG. 23 is a schematic view of a cooling system according to a 15th embodiment of the present invention.

The present embodiment is a modification of the 13th embodiment shown in FIG. 21 and, as shown in FIG. 23, arranges the indoor unit 17a at a location of a large amount of emission of heat and a large fluctuation of the amount of emission of heat (in the present embodiment, the second heat emitter 3).

Due to this, it becomes possible to cool a portion of a large amount of emission of heat and fluctuation of amount of emission of heat by a third cooling means 17 and to apply the refrigerator 4 to a portion of a slight emission of heat (in the present embodiment, the first heat emitter 2), so it is possible to operate the refrigerator 4 with a relatively small cooling capacity stably and possible to operate the cooling system efficiently.

(16th Embodiment)

Figure 24:
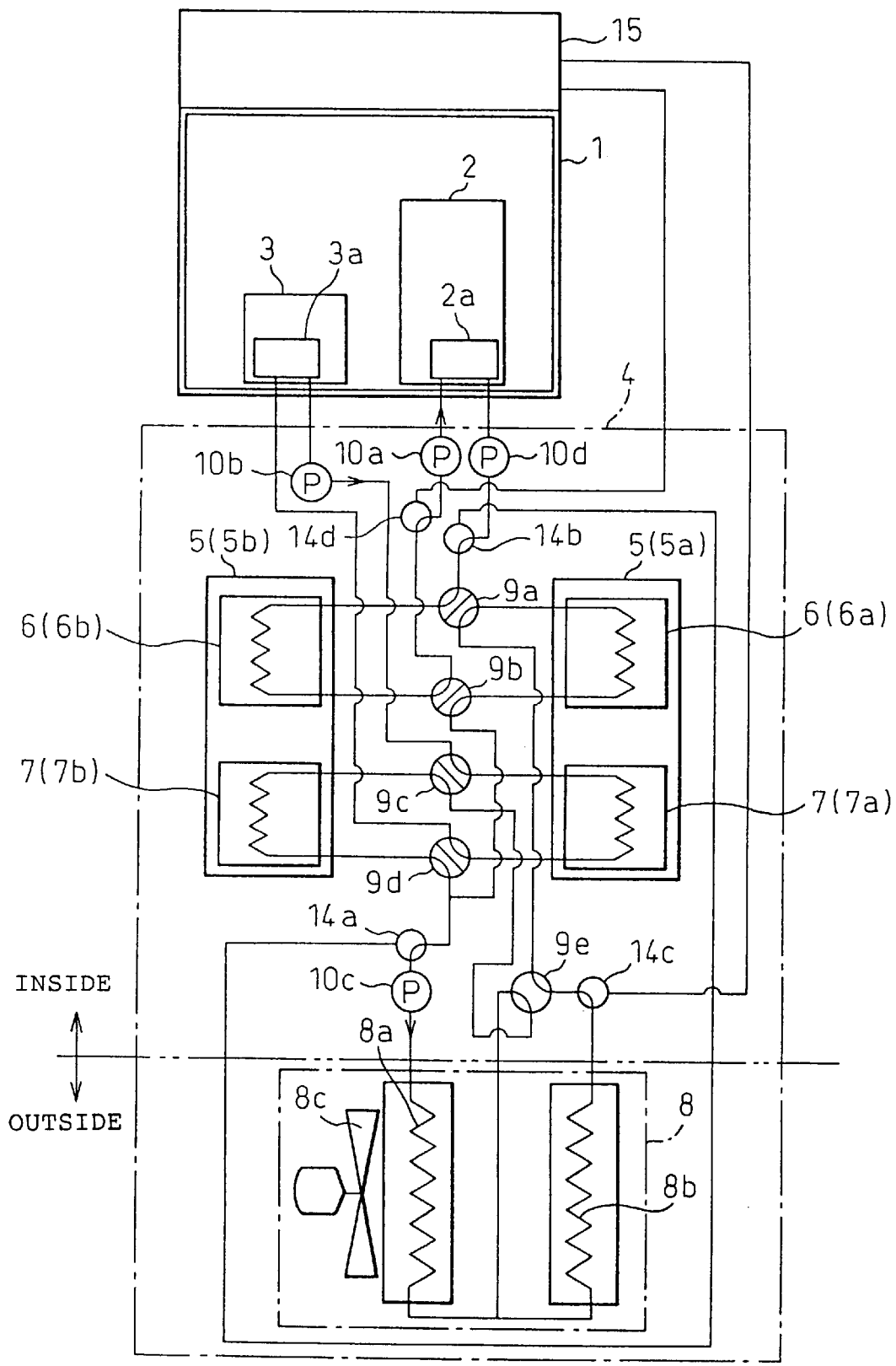
FIG. 24 is a schematic view of a cooling system according to a 16th embodiment of the present invention.

The present embodiment, as shown in FIG. 24, arranges the reserve tank 15 above the base station 1 so the reserve tank 15 is made to function as a sunlight blocking means for blocking the sunlight descending into the base station 1 and the cooling load of the refrigerator 1 etc. is reduced.

(Other Embodiments)

Further, in the above embodiments, the present invention was explained taking as an example the base station of a cellular phone system, but the heat emitters covered by the cooling system of the present invention are not limited to this. The system may also be applied to cooling of a plurality of types of heat emitters installed in a space in a building, underground room, factory, warehouse, housing, garage, vehicle, etc. (for example, a gas turbine engine, gas engine, diesel engine, gasoline engine, fuel cell, electronic equipment, electrical equipment, electrical converter, battery, the living space of animals (including humans), etc.)

Further, the space to be cooled is not limited to a closed space and may also be an open space.

Further, the radiated location of the cooling system of the present invention (location receiving heat from the outdoor unit 8 or other radiators of the refrigerators 4, 11, and 17) is not limited to the outside air (atmosphere) and may also be river water, underground water, the ground, seawater, outer space, etc.

Further, the refrigerant is not limited to water and may also be alcohol or another substance.

Further, in the above embodiments, a solid adsorbent was used as the adsorbent (adsorption medium), but the present invention is not limited to that. It is also possible to use a honeycomb structure adsorbent impregnated with lithium bromide or ammonia or another adsorbing solution.

Further, the cooling system of the present invention may also be applied to a heat management system provided with for example a heater for heating water for baths, a heater for heating air for air-conditioning to be blown into a room, a heater etc. for melting snow, etc. so as to enable use of the heat discharged from the cooling systems shown in the above embodiments.

What is claimed is:

1. A cooling system for heat emitters characterized by absorbing heat from a first heat emitter (2) present in a closed space (1) and cooling a second heat emitter (3) present in said closed space (1) by a first cooling means (4) operating by said absorbed heat.

2. A cooling system as set forth in claim 1, characterized in that the closed space (1) is a space in a cellular phone base station.

3. A cooling system as set forth in claim 2, characterized in that the first and second heat emitters (2 and 3) are electrical equipment installed in said cellular phone base station.

4. A cooling system as set forth in claim 1, characterized in that said first cooling means (4) is an adsorption type refrigerator having an adsorbent which adsorbs evaporated gaseous phase refrigerant and which desorbs the adsorbed refrigerant when heated.

5. A cooling system as set forth in claim 4, characterized by
   having a plurality of absorbers (5) housing an adsorbent and a plurality of valves (9a to 9e) for switching between an adsorption step and desorption step of the absorbers (5) by switching the flow of the heat medium and
   having the first cooling means (4) be set so that it can exhibit a predetermined reference refrigerating capacity by a predetermined reference amount of emission of heat in the first heat emitter (2) even when simultaneously operating said plurality of valves (9a to 9e) and switching the absorbers (5) from a desorption step to an adsorption step.

6. A cooling system as set forth in claim 4, characterized by
   having a plurality of absorbers (5) housing an adsorbent and a plurality of valves (9a to 9e) for switching between an adsorption step and desorption step of the absorbers (5) by switching the flow of the heat medium and
   making the heat medium recovering the heat from the first heat emitter (2) circulate directly to an outdoor unit (8) without going through the valves (9a to 9e) and have the outdoor unit (8) radiate the heat of the first heat emitter (2) when the valves (9a to 9e) start malfunctioning.

7. A cooling system as set forth in claim 4, characterized by
   having a plurality of absorbers (5) housing an adsorbent and a pump for circulating the heat medium (10a) and
   operating an emergency pump (10d) when the pump (10a) starts malfunctioning.

8. A cooling system as set forth in claim 1, characterized by having a second cooling means (11) for additionally cooling the first heat emitter (2) or the second heat emitter (3).

9. A cooling system as set forth in claim 1, characterized by having an auxiliary heat source (12) for supplying heat to said first cooling means (4).

10. A cooling system as set forth in claim 1, characterized by being configured so that
    when the amount of emission of heat of the first heat emitter (2) exceeds a predetermined amount, the coefficient of performance of the first cooling means (4) is lowered for operation,
    while when the amount of emission of heat of the first heat emitter (2) falls below a predetermined amount, the coefficient of performance of the first cooling means (4) is raised for operating the first cooling means (4).

11. A cooling system as set forth in claim 1, characterized by being configured so that when the amount of emission of heat of the first heat emitter (2) exceeds a predetermined amount, part of the heat of the first heat emitter (2) is radiated to the outside of the first cooling means (4).

12. A cooling system as set forth in claim 1, characterized by being configured so that when the temperature of the location where the first cooling means (4) radiates its heat falls below a predetermined temperature or when the first cooling means (4) breaks down, the heat of at least the first heat emitter (2) is discharged directly to the radiated location without going through the first cooling means (4).

13. A cooling system as set forth in claim 1, characterized by being configured so that when the temperature of heat emission of the first heat emitter (2) is higher than the temperature of heat emission of the second heat emitter (3) and the temperature of the location where the first cooling means (4) radiates its heat is lower than a predetermined temperature or when the first cooling means (4) breaks down, it is preferable to discharge the heat of the first heat emitter (2) to the radiated location of a temperature higher than the radiated location of the heat of the second heat emitter (3) without going through the first cooling means (4).

14. A cooling system as set forth in claim 1, characterized by being configured so that when the temperature of the location where the first cooling means (4) radiates its heat is lower than a predetermined temperature or the first cooling means (4) breaks down, the heat of one of the first heat emitter (2) and the second heat emitter (3) is discharged directly to the radiated location without going through the first cooling means (4).

15. A cooling system as set forth in claim 1, characterized by having a reserve tank (15) for supplying a heat medium.

16. A cooling system as set forth in claim 1, characterized by having a third refrigerator (17) having an indoor unit (17a) for recovering heat arranged inside the space (1).

17. A cooling system as set forth in claim 16, characterized in that the indoor unit (17a) is arranged right after a waste heat exhaust port of at least one of the first heat emitter (2) and second heat emitter (3).

18. A cooling system as set forth in claim 16, characterized in that the indoor unit (17a) is arranged at a location of a large amount of emission of heat.

19. A cooling system as set forth in claim 1, characterized in that the first heat emitter (2) and the second heat emitter (3) are electrical equipment which operate linked with each other.

20. A cooling system as set forth in claim 1, characterized in that the amount of emission of heat of the second heat emitter (3) is made lower than the amount of emission of heat of the first heat emitter (2) at all times.

21. A heat management system provided with a cooling system as set forth in claim 1,
    said heat management system characterized by being provided with equipment utilizing the heat exhausted from the cooling system.

22. A cooling system of heat emitters characterized by absorbing heat from a first heat emitter (2) present in a closed space (1) and cooling a second heat emitter (3) present in the closed space (1) by a first cooling means (4) operating by said absorbed heat by using as the first cooling means (4) an adsorption type refrigerator having an adsorbent which adsorbs the evaporated gaseous phase refrigerant and which desorbs the adsorbed refrigerant when heated and operating the first cooling means (4) by an absorber (5) not suffering from a malfunction among a plurality of absorbers (5) when any one of the plurality of absorbers (5) of the first cooling means (4) starts to malfunction.

23. A cooling system as set forth in claim 22, characterized by having a reserve tank (15) for supplying a heat medium.

24. A cooling system as set forth in claim 22, characterized by having a third refrigerator (17) having an indoor unit (17a) for recovering heat arranged inside the space (1).

25. A cooling system as set forth in claim 24, characterized in that the indoor unit (17a) is arranged right after a waste heat exhaust port of at least one of the first heat emitter (2) and second heat emitter (3).

26. A cooling system as set forth in claim 24, characterized in that the indoor unit (17a) is arranged at a location of a large amount of emission of heat.

27. A cooling system as set forth in claim 22, characterized in that the first heat emitter (2) and the second heat emitter (3) are electrical equipment which operate linked with each other.

28. A cooling system as set forth in claim 22, characterized in that the amount of emission of heat of the second heat emitter (3) is made lower than the amount of emission of heat of the first heat emitter (2) at all times.

29. A heat management system provided with a cooling system as set forth in claim 22, said heat management system characterized by being provided with equipment utilizing the heat exhausted from the cooling system.

30. A cooling system for heat emitters characterized by absorbing heat from a first heat emitter present in a closed space and cooling a second heat emitter present in said closed space by a first cooling means operating by said absorbed heat, said cooling system having a reserve tank for supplying a heat medium, said reserve tank (15) being arranged above said closed space (1).

31. A cooling system of heat emitters characterized by absorbing heat from a first heat emitter present in a closed space and cooling a second heat emitter present in said cold space by a first cooling means operating by said absorbed heat by using as the first cooling means an absorption type refrigerator having an absorbent which absorbs the evaporated gaseous phase refrigerant when heated and operating the first cooling means by an absorber not suffering from a malfunction among a plurality of absorbers when any one of the plurality of absorbers of the first cooling means starts to malfunction, said cooling system having a reserve tank for supplying a heat medium, said reserve tank (15) is arranged above said space (1).

* * * * *